United States Patent
Masuoka et al.

(10) Patent No.: US 8,154,086 B2
(45) Date of Patent: Apr. 10, 2012

(54) SEMICONDUCTOR SURROUND GATE SRAM STORAGE DEVICE

(75) Inventors: Fujio Masuoka, Chuo-ku (JP); Shintaro Arai, Chuo-ku (JP)

(73) Assignee: Unisantis Electronics Singapore Pte Ltd., Peninsula Plaza (SG)

( * ) Notice: Subject to any disclaimer, the term of this patent is extended or adjusted under 35 U.S.C. 154(b) by 190 days.

(21) Appl. No.: 12/703,968

(22) Filed: Feb. 11, 2010

(65) Prior Publication Data

US 2010/0200913 A1 Aug. 12, 2010

Related U.S. Application Data

(63) Continuation of application No. PCT/JP2009/051462, filed on Jan. 29, 2009.

(60) Provisional application No. 61/207,711, filed on Feb. 13, 2009.

(30) Foreign Application Priority Data

Jan. 29, 2008 (WO) .................. PCT/JP2008/051303

(51) Int. Cl.
*H01L 21/8244* (2006.01)
*H01L 27/11* (2006.01)

(52) U.S. Cl. .................. 257/380; 257/E27.098; 365/188

(58) Field of Classification Search .................. 257/380, 257/E27.098, E27.101; 365/188
See application file for complete search history.

(56) References Cited

U.S. PATENT DOCUMENTS

| | | | |
|---|---|---|---|
| 5,258,635 A * | 11/1993 | Nitayama et al. | ............. 257/329 |
| 5,308,778 A | 5/1994 | Fitch et al. | |
| 5,308,782 A | 5/1994 | Mazuré et al. | |
| 5,330,927 A | 7/1994 | Lee | |
| 5,376,814 A | 12/1994 | Lee | |
| 5,398,200 A | 3/1995 | Mazuré et al. | |
| 5,612,563 A | 3/1997 | Fitch et al. | |
| 5,994,735 A | 11/1999 | Maeda et al. | |
| 6,127,209 A | 10/2000 | Maeda et al. | |
| 2002/0027802 A1 * | 3/2002 | Noble | ............................ 365/154 |
| 2002/0195652 A1 | 12/2002 | Maeda et al. | |

(Continued)

FOREIGN PATENT DOCUMENTS

JP 02-156664 A 6/1990

(Continued)

OTHER PUBLICATIONS

International Search Report for International Application No. PCT/JP2008/051303, dated Apr. 8, 2008, 2 pages.

(Continued)

*Primary Examiner* — Jerome Jackson, Jr.
*Assistant Examiner* — Paul Budd
(74) *Attorney, Agent, or Firm* — Brinks Hofer Gilson & Lione

(57) ABSTRACT

It is intended to achieve a sufficiently-small SRAM cell area and a stable operation margin in an E/R type 4T-SRAM comprising a vertical transistor SGT. In a static type memory cell made up using four MOS transistors and two load resistor elements, each of the MOS transistor constituting the memory cell is formed on a planar silicon layer formed on a buried oxide film, to have a structure where a drain, a gate and a source are arranged in a vertical direction, wherein the gate is formed to surround a pillar-shaped semiconductor layer, and each of the load resistor elements is made of polysilicon and formed on the planar silicon layer.

8 Claims, 21 Drawing Sheets

U.S. PATENT DOCUMENTS

| | | | |
|---|---|---|---|
| 2004/0084676 A1* | 5/2004 | Takaura et al. | 257/67 |
| 2004/0113207 A1 | 6/2004 | Hsu et al. | |
| 2004/0135215 A1 | 7/2004 | Song | |
| 2007/0007601 A1 | 1/2007 | Hsu et al. | |

FOREIGN PATENT DOCUMENTS

| | | |
|---|---|---|
| JP | 02-188966 A | 7/1990 |
| JP | 06-069441 A | 3/1994 |
| JP | 06-151772 A | 5/1994 |
| JP | 07-099311 A | 4/1995 |
| JP | 10-079482 A | 3/1998 |
| JP | 2004-193588 A | 7/2004 |
| JP | 2008-205168 A | 9/2008 |

OTHER PUBLICATIONS

International Search Report for International Application No. PCT/JP2009/051462, dated Apr. 21, 2009, 2 pages.

Written Opinion of the International Searching Authority for International Application No. PCT/JP2008/051303, dated Apr. 8, 2008, 6 pages.

Written Opinion of the International Searching Authority for International Application No. PCT/JP2009/051462, dated Apr. 21, 2009, 5 pages.

* cited by examiner (a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

(a)

(b)

US 8,154,086 B2

SEMICONDUCTOR SURROUND GATE SRAM STORAGE DEVICE

RELATED APPLICATIONS

Pursuant to 35 U.S.C. §119(e), this application claims the benefit of the filing date of Provisional U.S. Patent Application Ser. No. 61/207,711 filed on Feb. 13, 2009. This application is a continuation application of PCT/JP2009/051462 filed on Jan. 29, 2009 which claims priority under 35 U.S.C. §365(a) to PCT/JP2008/051303 filed on Jan. 29, 2008. The entire contents of these applications are hereby incorporated by reference.

TECHNICAL FIELD

The present invention relates to a semiconductor storage device, and more particularly to a semiconductor storage device comprising an SRAM (Static Random Access Memory).

BACKGROUND ART

With a view to achieving higher integration and higher performance of a semiconductor device, an SGT (Surrounding Gate Transistor) has been proposed which is a vertical transistor comprising a pillar-shaped semiconductor layer formed on a surface of a semiconductor substrate, and a gate formed to surround a sidewall of the pillar-shaped semiconductor layer (as disclosed, for example, in Patent Document 1: JP 2-188966A). In the SGT, a source, a gate and a drain are arranged in a vertical direction, so that an occupancy area can be significantly reduced as compared with a conventional planar transistor.

In cases where an LSI (large-scale integration) circuit is made up using an SGT, it is essential to employ an SRAM comprising a combination of a plurality of SGTs, as a cache memory for the LSI circuit (the SRAM will hereinafter be referred to as "SGT-SRAM"). In recent years, there is an extremely strong need for increasing a capacity of an SRAM to be mounted on an LSI circuit. Thus, it is necessary to achieve an SRAM having a sufficiently-small cell area, irrespective of whether it is an SGT-SRAM. As compared with an SRAM made up using a conventional planar transistor, the SGT-SRAM has a higher potential to reduce an SRAM cell area by taking advantage of the feature of the SGT which is formed in a vertical direction.

FIG. 20(a) is a top plan view showing an E/R (enhancement/resistor) type 4T-SRAM described as an embodiment in the Patent Document 1, wherein an SRAM cell comprises four SGTs and two load resistor elements. FIG. 20(b) is a sectional view taken along the line A-A' in FIG. 20(a).

With reference to the top plan view of FIG. 20(a) and the sectional view of FIG. 20(b), a structure of the SRAM cell will be described below. The SRAM cell comprises two access transistors each formed by a pillar-shaped silicon layer (601a, 601b) and adapted to allow access to the memory cell, two driver transistors each formed by a pillar-shaped silicon layer (602a, 602b) and adapted to drive the memory cell so as to read and write data, and two load resistor elements Ra6, Rb6 each formed by a polysilicon interconnection layer. A lower diffusion layer (607a, 607b, 607) is formed underneath each of the pillar-shaped silicon layers, and an upper diffusion layer 608 is formed in an upper portion of each of the pillar-shaped silicon layers. Further, a gate electrode (606a to 606c) is formed around each of the pillar-shaped silicon layers.

Each of BL6 and BLB6 indicates a bit line, and WL6 indicates a word line. Vcc6 indicates a power supply potential line, and Vss6 indicates a ground potential line. Each of Ma6 and Mb6 indicates a storage node formed by an interconnection layer and adapted to store data therein.

Patent Document 1: JP 2-188966A

In reality, the above SRAM cell involves the following problem. During data reading, data stored in the storage node formed by the interconnection layer (Ma6, Mb6) is read out to the lower diffusion layer (607a, 607b) underneath the access transistor. The readout data is transferred to the bit line (BL6, BLB6) composed of an interconnection layer, via a contact (603a, 603b). In this structure, the contact (603a, 603b) is not an essential component of the SRAM. For example, in a SRAM cell structure where a storage node is formed by the lower diffusion layer underneath the pillar-shaped silicon layer, data stored in the storage node is transferred to the bit line composed of an interconnection layer via a contact formed on a top of the access transistor, so that the contact (603a, 603b) in the above SRAM cell becomes unnecessary. In this case, an SRAM cell area can be reduced by an area of the two contacts.

In the above SRAM cell, the load resistor element (Ra6, Rb6) is formed by the polysilicon interconnection layer, and thereby the formation of the load resistor element leads to a significant increase in SRAM cell area. Thus, as a prerequisite to reducing the SRAM cell area, it is necessary to use a load resistor element capable of minimizing an increase in SRAM cell area.

Moreover, in the above SRAM cell, the word line WL6 has a high resistance because it is made of polysilicon. Thus, in order to achieve an operating speed currently required in an LSI, it is necessary to add one contact to the word line to allow the word line to be lined with an interconnection layer so as to reduce the resistance. This causes a further increase in SRAM cell area.

As above, the SGT-SRAM has a higher potential to reduce an SRAM cell area based on the feature of the SGT which is formed in a vertical direction, as compared with an SRAM made up using a planar transistor. However, considering the above problems, there remains a need for further reducing the SRAM cell area.

In view of the above circumstances, it is an object of the present invention to provide an SGT-based E/R type 4T-SRAM capable of achieving a SRAM cell having a smaller area.

SUMMARY OF THE INVENTION

In order to achieve the above object, the present invention provides a semiconductor storage device comprising a static type memory cell in which four MOS transistors and two load resistor elements are arrayed on a dielectric film formed on a substrate. In the semiconductor storage device, each of the four MOS transistors comprises a source diffusion layer, a drain diffusion layer, a pillar-shaped semiconductor layer disposed between the source and drain diffusion layers, and a gate formed along a sidewall of the pillar-shaped semiconductor layer, wherein the source diffusion layer, the drain diffusion layer and the pillar-shaped semiconductor layer are arranged on the dielectric film formed on the substrate, hierarchically in a vertical direction, and wherein the four MOS transistors function as respective ones of first and second NMOS access transistors each operable to hold data in the memory cell, and allow access to the memory cell, and first and second NMOS driver transistors each operable to drive a storage node so as to write and read data in the memory cell.

The first NMOS access transistor and the first NMOS driver transistor are arrayed in adjacent relation to each other, and the second NMOS access transistor and the second NMOS driver transistor are arrayed in adjacent relation to each other. The source or drain diffusion layer for the first NMOS access transistor and the first NMOS driver transistor is arranged on the dielectric film as a first diffusion layer shared by the first NMOS access transistor and the first NMOS driver transistor to serve as a first storage node for holding data therein, and the source or drain diffusion layer for the second NMOS access transistor and the second NMOS driver transistor is arranged on the dielectric film as a second diffusion layer shared by the second NMOS access transistor and the second NMOS driver transistor to serve as a second storage node for holding data therein. Further, the two load resistor elements are arranged on respective ones of the first diffusion layer and the second diffusion layer.

Preferably, in the semiconductor storage device of the present invention, the two load resistor elements are formed as a first contact plug made of a semiconductor or a metal and formed on the first diffusion layer, and a second contact plug made of a semiconductor or a metal and formed on the second diffusion layer.

Preferably, in the semiconductor storage device of the present invention, a contact to be formed on a gate line extending from a gate electrode of at least one of the first and second NMOS access transistors is shared as a contact to be formed on a gate line extending from a gate electrode of an NMOS access transistor in an adjacent memory cell.

Preferably, in the semiconductor storage device of the present invention, a gate line extending from the gate of the driver transistor formed on the first diffusion layer serving as the first storage node is connected to the second diffusion layer serving as the second storage node, through a common contact, and a gate line extending from the gate of the driver transistor formed on the second diffusion layer serving as the second storage node is connected to the first diffusion layer serving as the first storage node, through a common contact.

Preferably, in the semiconductor storage device of the present invention, a peripheral length of the sidewall in each of the pillar-shaped semiconductor layers forming the access transistors and the pillar-shaped semiconductor layers forming the driver transistors, is determined based on an operation margin during reading and an operation margin during writing.

In the semiconductor storage device of the present invention, the four MOS transistors may be arranged on the dielectric film in a two-row by two-column array, wherein: the first NMOS access transistor is arranged at an intersection of the 1st row and the 1st column; the first NMOS driver transistor is arranged at an intersection of the 2nd row and the 1st column; the second NMOS access transistor is arranged at an intersection of the 1st row and the 2nd column; and the second NMOS driver transistor is arranged at an intersection of the 2nd row and the 2nd column.

Alternatively, the four MOS transistors may be arranged on the dielectric film in a two-row by two-column array, wherein: the first NMOS access transistor is arranged at an intersection of the 1st row and the 1st column; the first NMOS driver transistor is arranged at an intersection of the 2nd row and the 1st column; the second NMOS access transistor is arranged at an intersection of the 2nd row and the 2nd column; and the second NMOS driver transistor is arranged at an intersection of the 1st row and the 2nd column.

DETAILED DESCRIPTION OF THE PREFERRED EMBODIMENTS

First Embodiment

Figure 1:
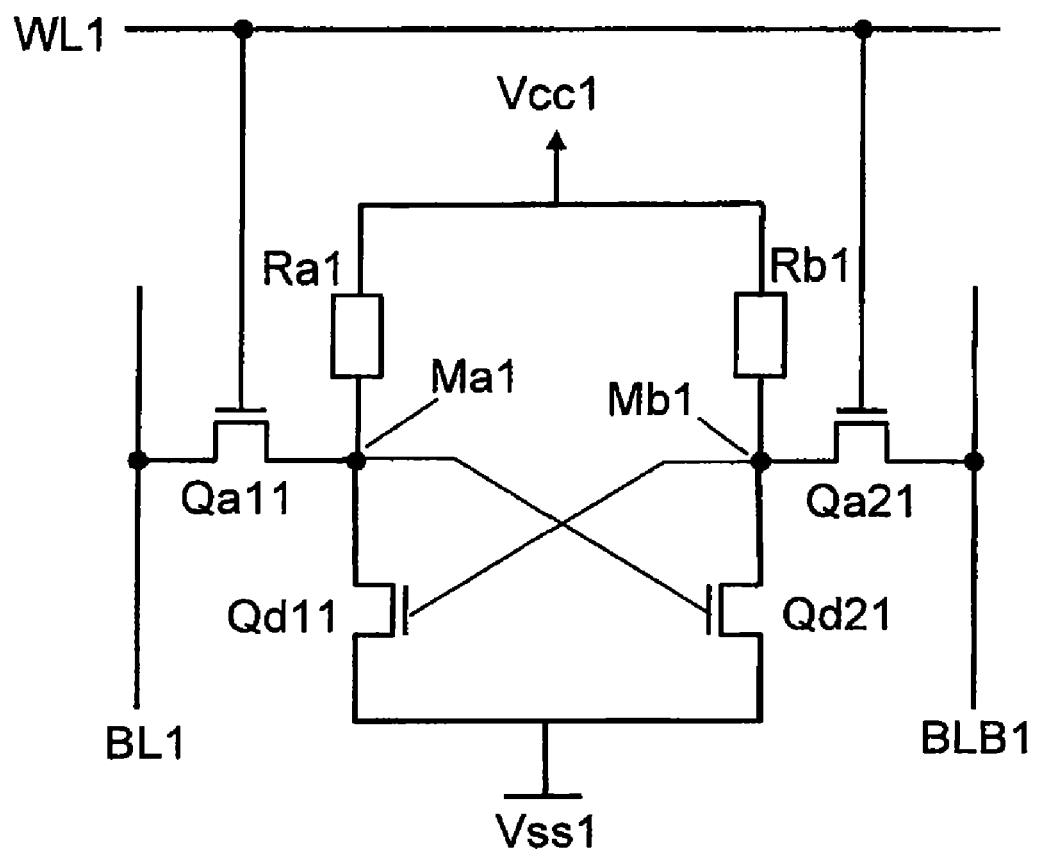
FIG. 1 illustrates an equivalent circuit of a memory cell of an SRAM according to a first embodiment of the present invention.

FIG. 1 illustrates an equivalent circuit of a memory cell in an E/R type 4T-SRAM according to a first embodiment of the present invention. In FIG. 1, each of BL1 and BLB1 indicates a bit line, and WL1 indicates a word line. Vcc1 indicates a power source potential, and Vss1 indicates a ground potential. Each of Qa11 and Qa21 indicates an access transistor operable to allow access to the memory cell, and each of Qd11 and Qd21 indicates a driver transistor operable to drive an after-mentioned storage node so as to read and write data from/to the memory cell. Each of Ra1 and Rb1 indicates a load resistor element for supplying electric charges to the after-mentioned storage node, and each of Ma1 and Mb1 indicates a storage node for storing data therein.

Figure 2:
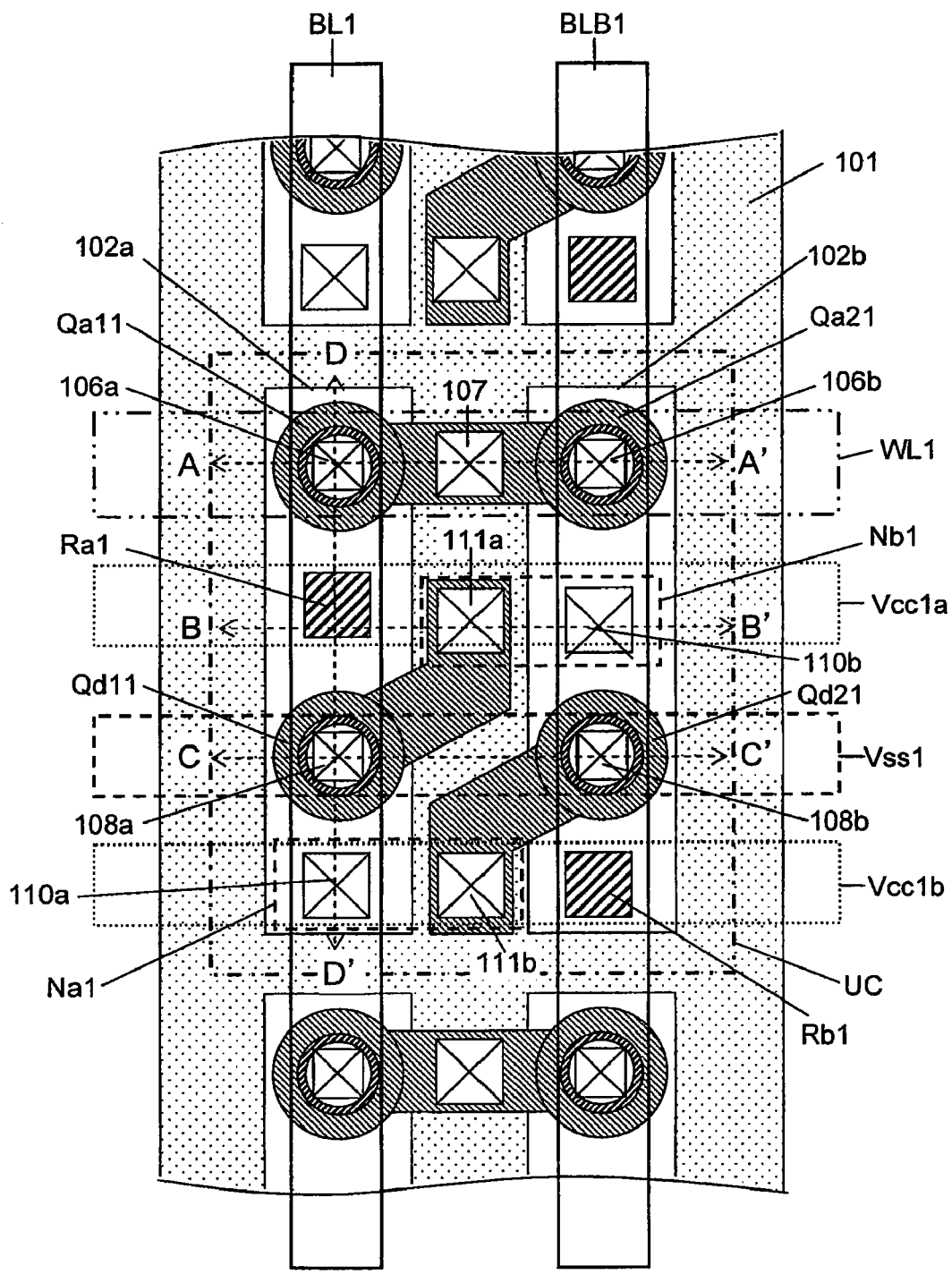
FIG. 2 is a top plan view showing the memory cell of the SRAM according to the first embodiment.

FIG. 2 illustrates a layout of the memory cell in the SRAM according to the first embodiment. In an SRAM cell array, a unit cell illustrated in FIG. 2 is iteratively arranged. FIGS. 3(a) to 3(d) are sectional views taken along the lines A-A', B-B', C-C' and D-D' in FIG. 2, respectively.

With reference to FIGS. 2 and 3(a) to 3(d), the layout of the memory cell in the SRAM according to the first embodiment will be described below.

A planar silicon layer (102a, 102b) is formed on a dielectric film, such as a buried oxide film layer 101, formed on a substrate. The planar silicon layer (102a, 102b) is formed as an $N^+$ diffusion layer (103a, 103b), by impurity implantation or the like. The planar silicon layer 102a and the planar silicon layer 102b serve as a storage node Ma1 and a storage node Mb1, respectively. In FIGS. 2 and 3(a) to 3(d), each of Qa11 and Qa21 indicates an access transistor, and each of Qd11 and Qd21 indicates a driver transistor. Further, each of Ra1 and Rb1 indicates a load resistor element formed as a contact plug made of a semiconductor material, such as polysilicon.

In the first embodiment, one unit cell UC comprises four transistors arranged on the buried oxide film layer 101 in a two-row by two-column array. In the 1st column, the access transistor Qa11 and the driver transistor Qd11 are arranged on the planar silicon layer 102a serving as a first storage node, in a downward direction in FIG. 2. In the 2nd column, the access transistor Qa21 and the driver transistor Qd21 are arranged on the planar silicon layer 102b serving as a second storage node, in the downward direction in FIG. 2. The SRAM cell array in the first embodiment is formed by continuously arranging a plurality of the unit cells UC each comprising the four transistors, in an upward-downward direction in FIG. 2.

As seen in FIGS. 2 and 3(a) to 3(d), the $N^+$ diffusion layer 103a (planar silicon layer 102a) serving as the first storage node is arranged on the buried oxide film layer 101 as a diffusion layer shared by the access transistor Qa11 and the driver transistor Qd11. Similarly, the $N^+$ diffusion layer 103b (planar silicon layer 102b) serving as the second storage node is arranged on the buried oxide film layer 101 as a diffusion layer shared by the access transistor Qa21 and the driver transistor Qd21.

A contact 110a formed on the planar silicon layer 102a is connected to a contact 111b formed on a gate line extending from a gate electrode of the driver transistor Qd21, through a node interconnection line Na1. A contact 110b formed on the planar silicon layer 102b is connected to a contact 111a formed on a gate line extending from a gate electrode of the driver transistor Qd11, through a node interconnection line Nb1. A contact 106a formed on a top of the access transistor Qa11 is connected to a bit line BL1, and a contact 106b formed on a top of the access transistor Qa21 is connected to a bit line BLB1. A contact 107 formed on a gate line extending from respective gate electrodes of the access transistor Qa11 and the access transistor Qa21 is connected to a word line WL1. A contact (108a, 108b) formed on a top of the driver transistor (Qd11, Qd21) is connected to an interconnection layer Vss1 having a ground potential. The contact plug Ra1 and the contact plug Rb1 each made of a semiconductor material, such as polysilicon, are connected, respectively, to an interconnection line Vcc1a and an interconnection line Vcc1b each having a power supply potential.

Preferably, in order to share each of the word line, the bit line, the power supply potential line and the ground potential line, with other memory cells, such a line is connected to each of the memory cells through a higher-level layer than a node interconnection line to be wired in each of the memory cells.

As one example of the hierarchical wiring configuration, it is contemplated that the node interconnection line (Na1, Nb1) and the ground potential line Vss1 are wired in a lowest-level layer, and the power supply potential line (Vcc1, Vcc1b) is wired in a higher-level layer than them, wherein the bit line (BL1, BLB1) is wired in a higher-level layer than the power supply potential line, and the word line WL1 is wired in a highest-level layer, to keep each line from coming in contact with an unintended one of the contacts.

In the first embodiment, a source and a drain in each of the transistors constituting the SRAM are defined as follows. In regard to the driver transistor (Qd11, Qd21), a diffusion layer formed in an upper portion of a pillar-shaped semiconductor layer and connected to the ground potential is defined as a source diffusion layer, and a diffusion layer formed underneath the pillar-shaped semiconductor layer is defined as a drain diffusion layer. In regard to the access transistor (Qa11, Qa21), although each of a diffusion layer formed in an upper portion of a pillar-shaped semiconductor layer and a diffusion layer formed underneath the pillar-shaped semiconductor layer serves as a source or a drain depending on an operating state, the diffusion layer formed in the upper portion of the pillar-shaped semiconductor layer and the diffusion layer formed underneath the pillar-shaped semiconductor layer are defined, respectively, as a source diffusion layer and a drain diffusion layer, for descriptive purposes.

With reference to the section views of FIGS. 3(a) to 3(d), a structure of the SRAM according to the first embodiment will be described below.

Figure 3A:
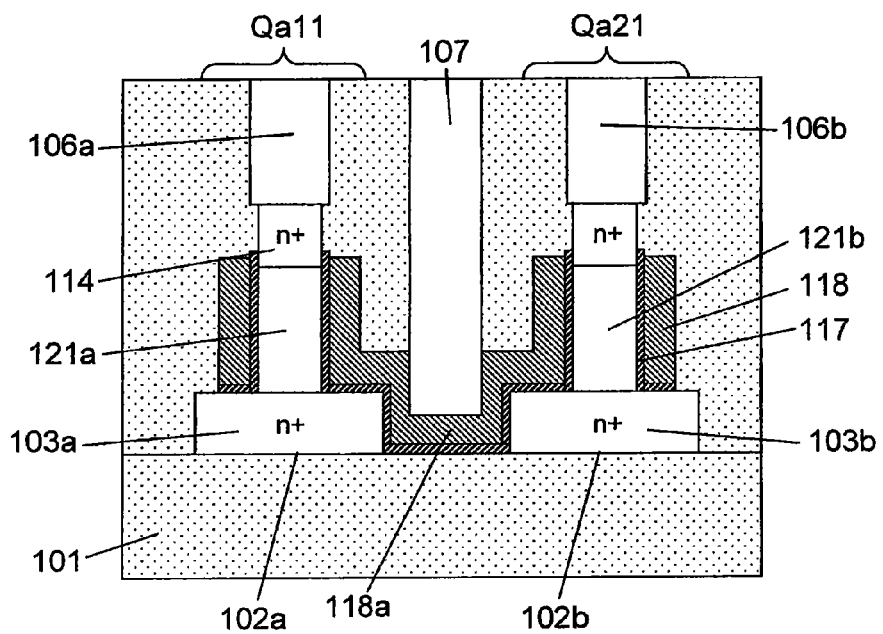
FIG. 3(a) is a sectional view showing the memory cell of the SRAM according to the first embodiment.

As shown in FIG. 3(a), a planar silicon layer (102a, 102b) serving as a storage node (Ma1, Mb1) is formed on a buried oxide film layer 101, wherein the planar silicon layer (102a, 102b) is formed as an $N^+$ drain diffusion layer (103a, 103b) by impurity implantation or the like. A pillar-shaped silicon layer 121a constituting an access transistor Qa11 is formed on the $N^+$ drain diffusion layer 103a, and a pillar-shaped silicon layer 121b constituting an access transistor Qa21 is formed on the $N^+$ drain diffusion layer 103b. A gate dielectric film 117 and a gate electrode 118 are formed around each of the pillar-shaped silicon layers. An $N^+$ source diffusion layer 114 is formed in an upper portion of the pillar-shaped silicon layer (121a, 121b) by impurity implantation or the like. Although not illustrated in FIG. 3(a), a contact 106a formed on the access transistor Qa11 and a contact 106b formed on the access transistor Qa21 are connected, respectively, to a bit line BL1 and a bit line BLB1, and a contact 107 formed on a gate line 118a extending from the respective gate electrodes of the access transistors Qa11, Qa21 is connected to a word line WL1.

Figure 3B:
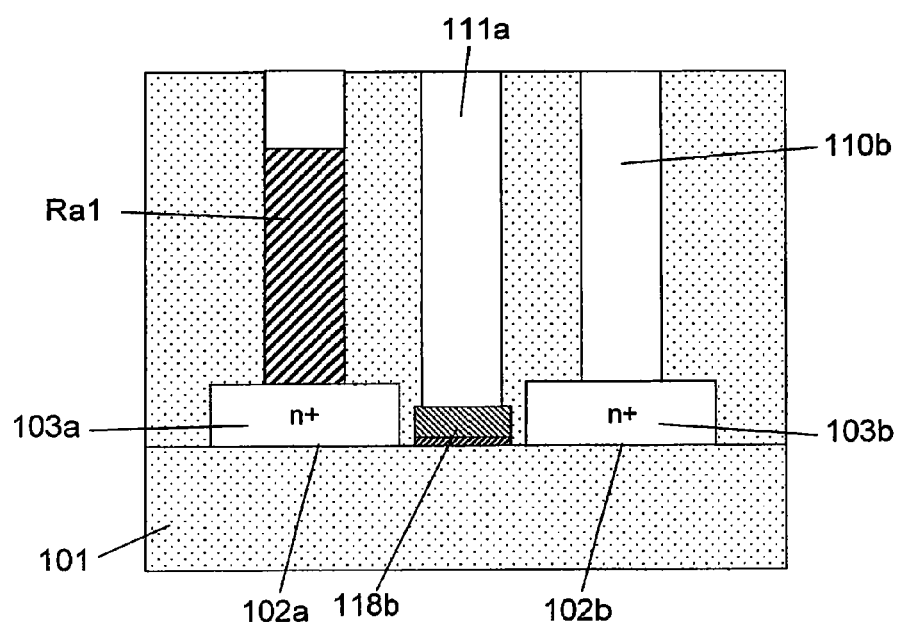
FIG. 3(b) is a sectional view showing the memory cell of the SRAM according to the first embodiment.

As shown in FIG. 3(b), the planar silicon layer (102a, 102b) serving as the storage node (Ma1, Mb1) is formed on the buried oxide film layer 101, wherein the planar silicon layer (102a, 102b) is formed as the $N^+$ drain diffusion layer (103a, 103b) by impurity implantation or the like. A contact plug Ra1 made of a semiconductor material, such as polysilicon, to serve as a load resistor element is formed on the planar silicon layer 102a. Although not illustrated in FIG. 3(b), a contact 111a formed on a gate line 118b extending from a gate electrode of a driver transistor Qd11 is connected to a contact 110b formed on the N⁺ drain diffusion layer 102b, through a storage node interconnection line Nb1.

Figure 3C:
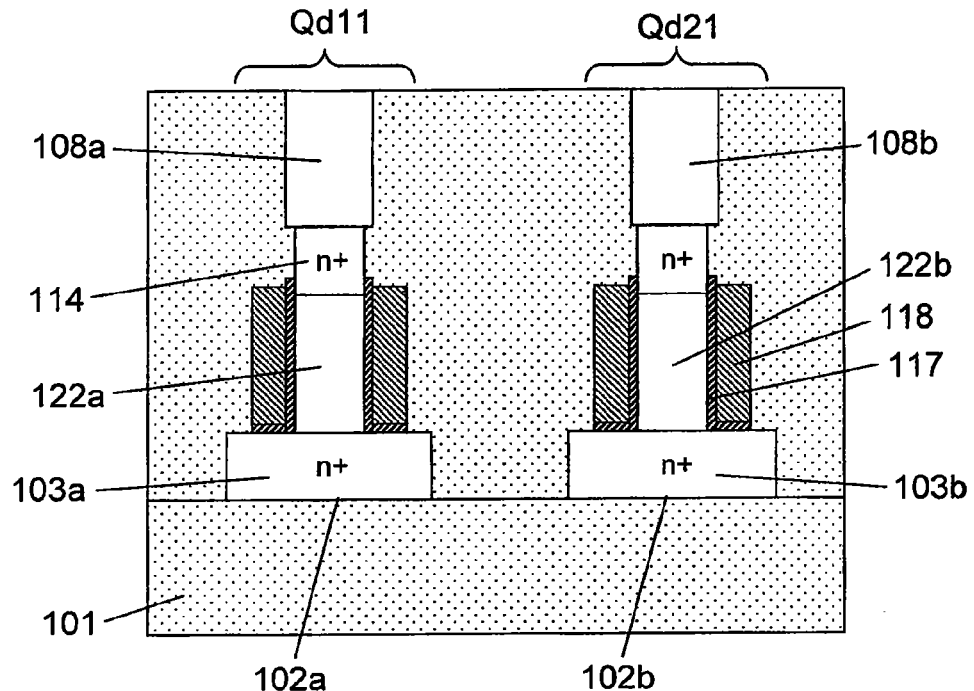
FIG. 3(c) is a sectional view showing the memory cell of the SRAM according to the first embodiment.

As shown in FIG. 3(c), the planar silicon layer (102a, 102b) serving as the storage node (Ma1, Mb1) is formed on the buried oxide film layer 101, wherein the planar silicon layer (102a, 102b) is formed as the N⁺ drain diffusion layer (103a, 103b) by impurity implantation or the like. A pillar-shaped silicon layer 122a constituting a driver transistor Qd11 is formed on the planar silicon layer 102a, and a pillar-shaped silicon layer 122b constituting a driver transistor Qd21 is formed on the planar silicon layer 102b. The gate dielectric film 117 and the gate electrode 118 are formed around each of the pillar-shaped silicon layers. An N⁺ source diffusion layer 114 is formed in an upper portion of the pillar-shaped silicon layer (122a, 122b) by impurity implantation or the like. Although not illustrated in FIG. 3(c), a contact (108a, 108b) formed on the driver transistor (Qd11, Qd21) is connected to a ground potential Vss1 through an interconnection layer.

Figure 3D:
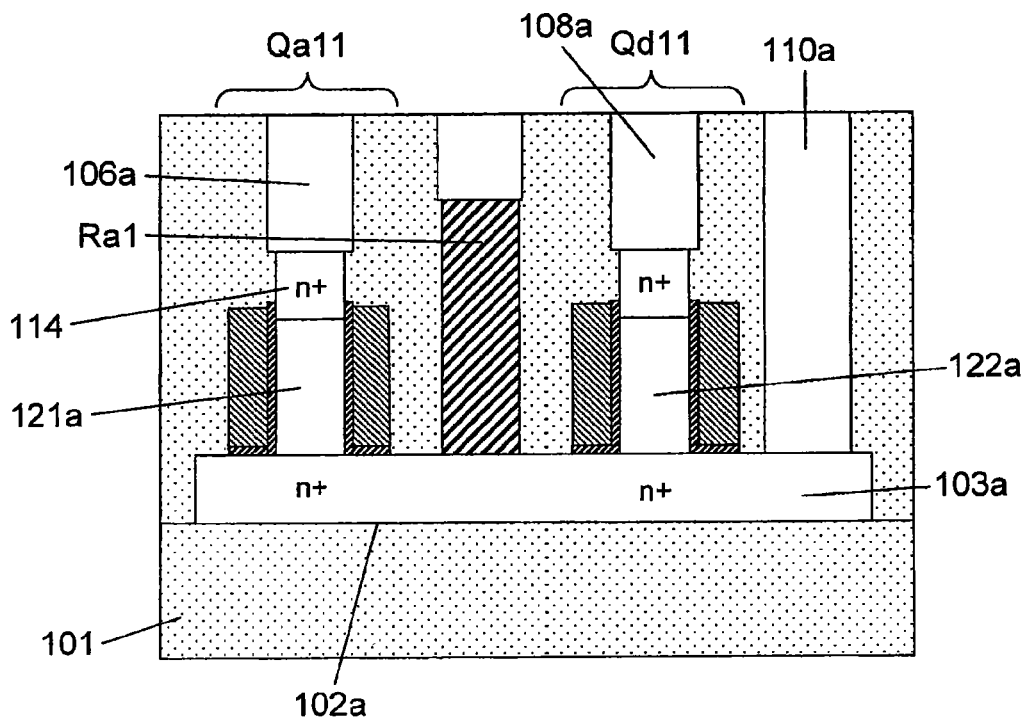
FIG. 3(d) is a sectional view showing the memory cell of the SRAM according to the first embodiment.
Figure 4:
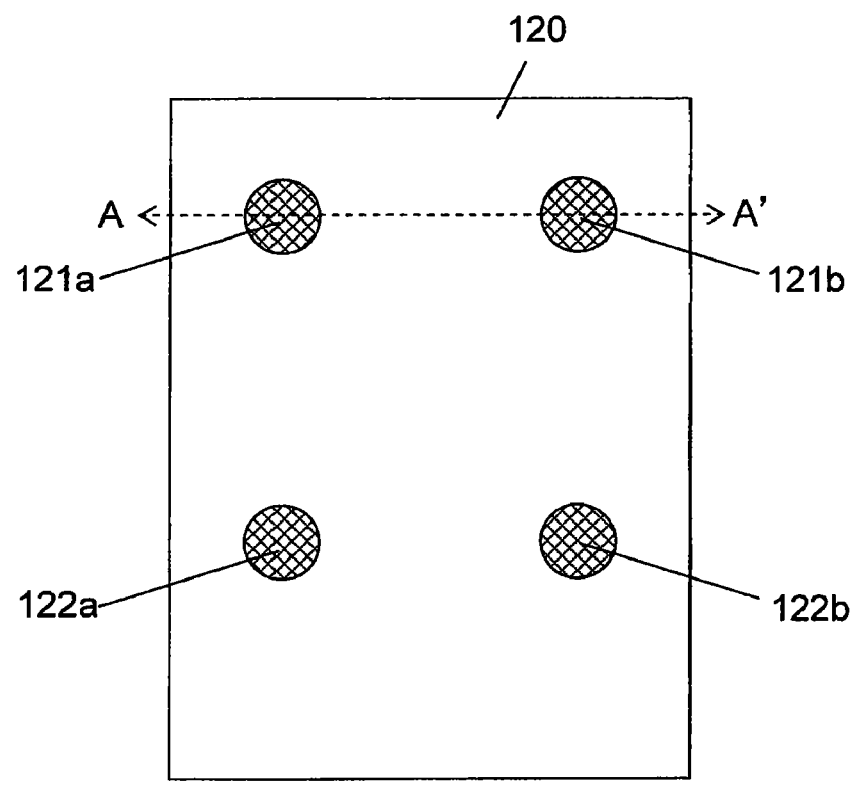
FIGS. 4(a) and 4(b) are process diagrams showing a production process of the SRAM according to the first embodiment, on a step-by-step basis.
Figure 4:
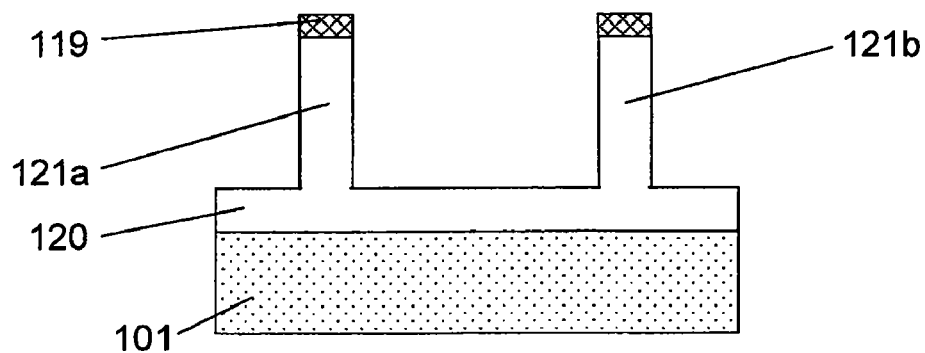
Figure 5:
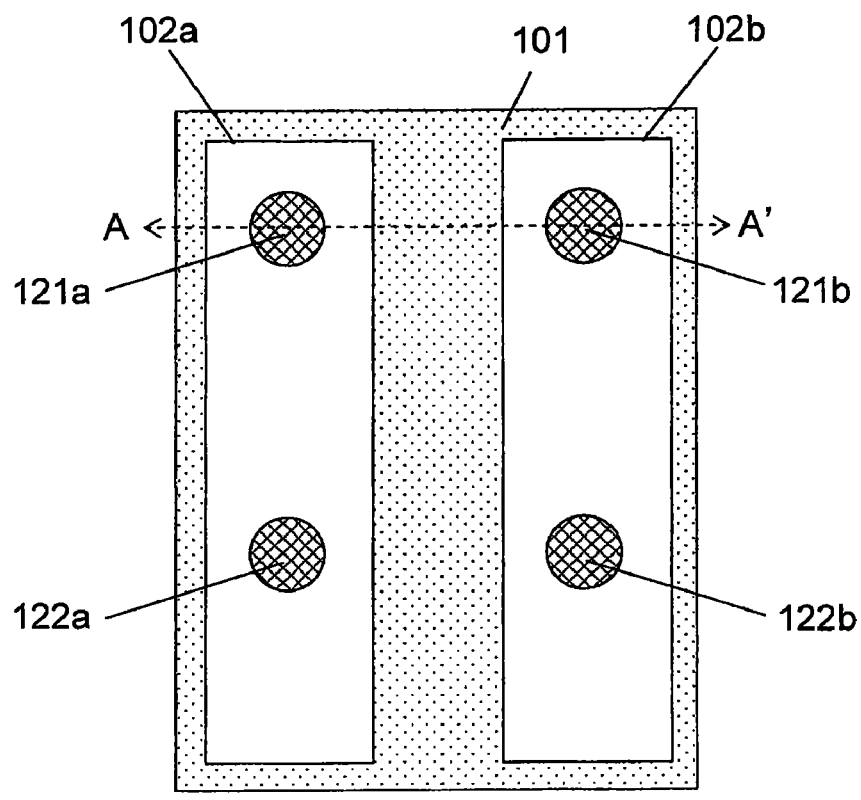
FIGS. 5(a) and 5(b) are process diagrams showing the production process of the SRAM according to the first embodiment, on a step-by-step basis.
Figure 5:
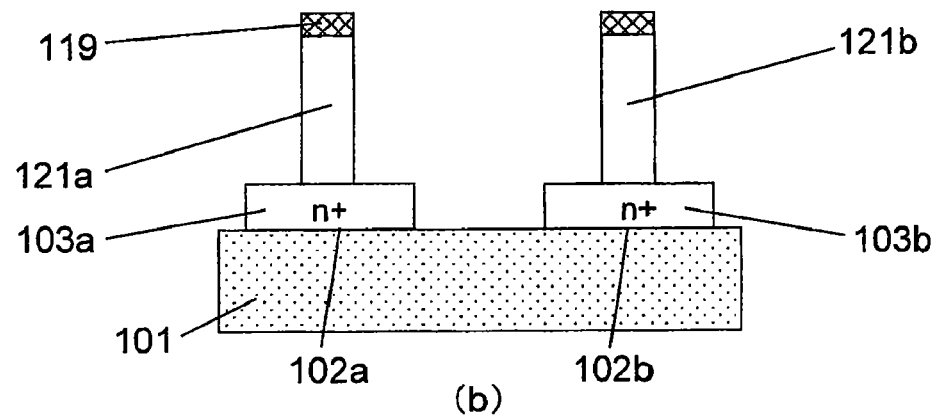
Figure 6:
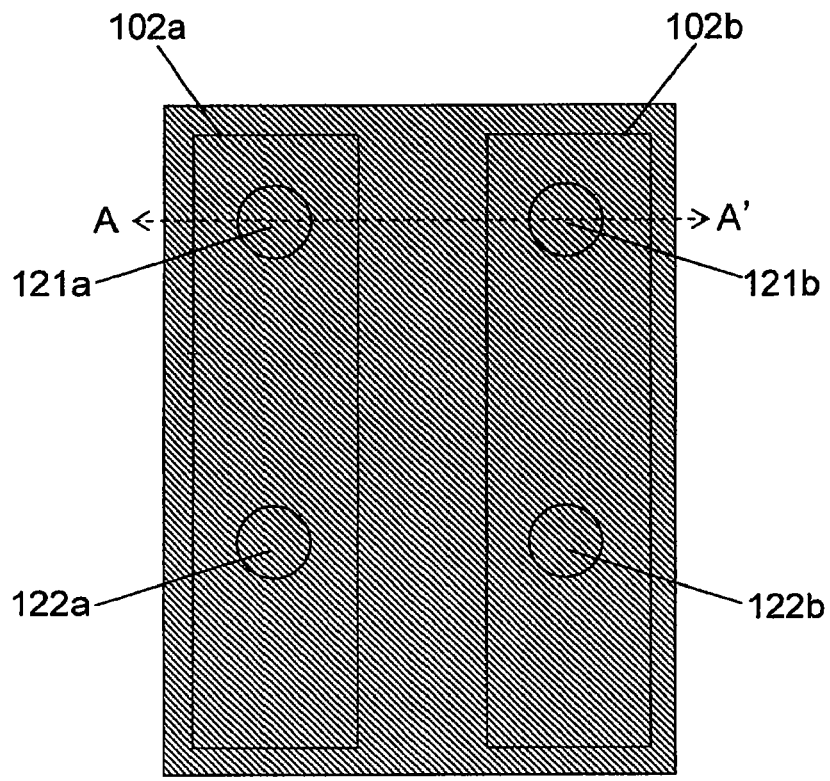
FIGS. 6(a) and 6(b) are process diagrams showing the production process of the SRAM according to the first embodiment, on a step-by-step basis.
Figure 6:
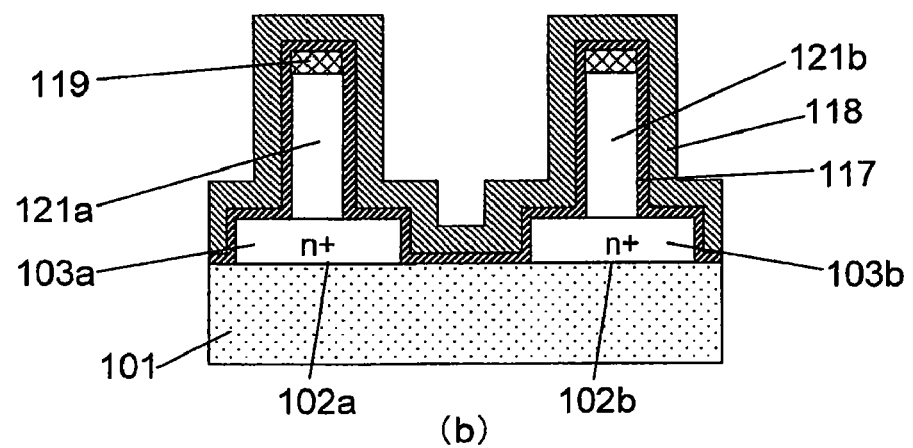
Figure 7:
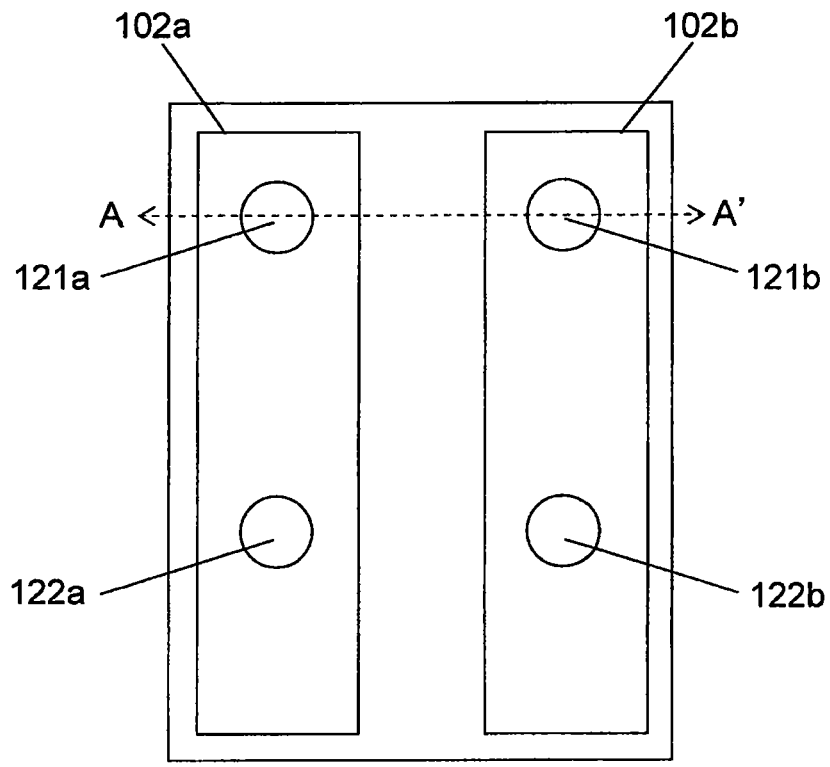
FIGS. 7(a) and 7(b) are process diagrams showing the production process of the SRAM according to the first embodiment, on a step-by-step basis.
Figure 7:
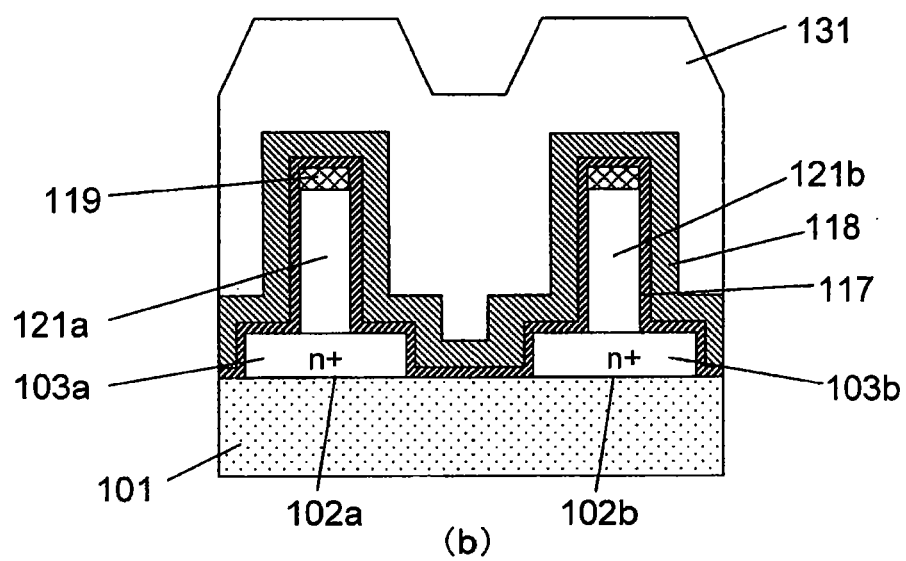
Figure 8:
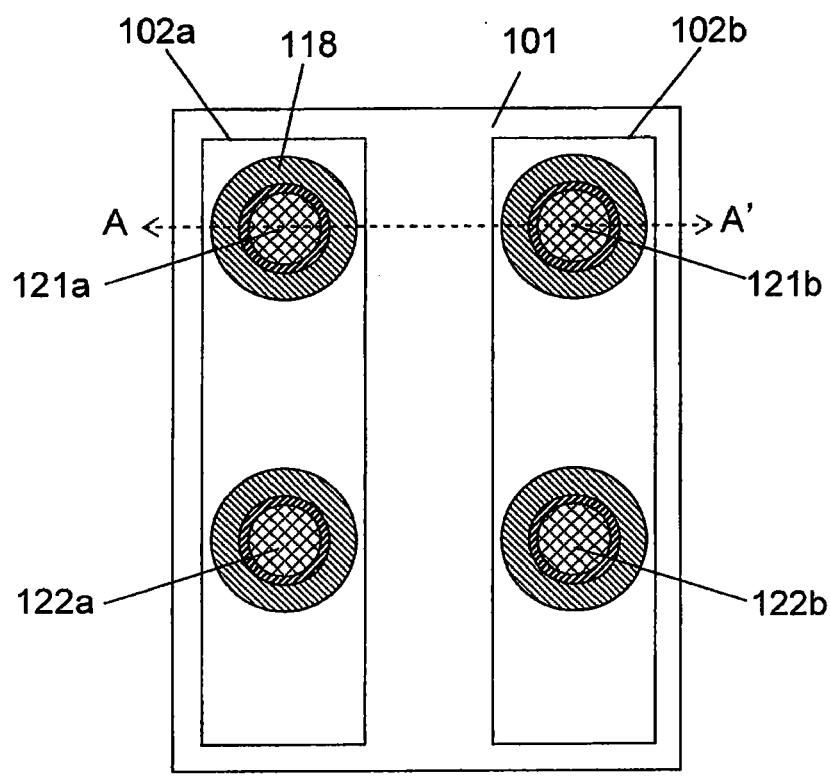
FIGS. 8(a) and 8(b) are process diagrams showing the production process of the SRAM according to the first embodiment, on a step-by-step basis.
Figure 8:
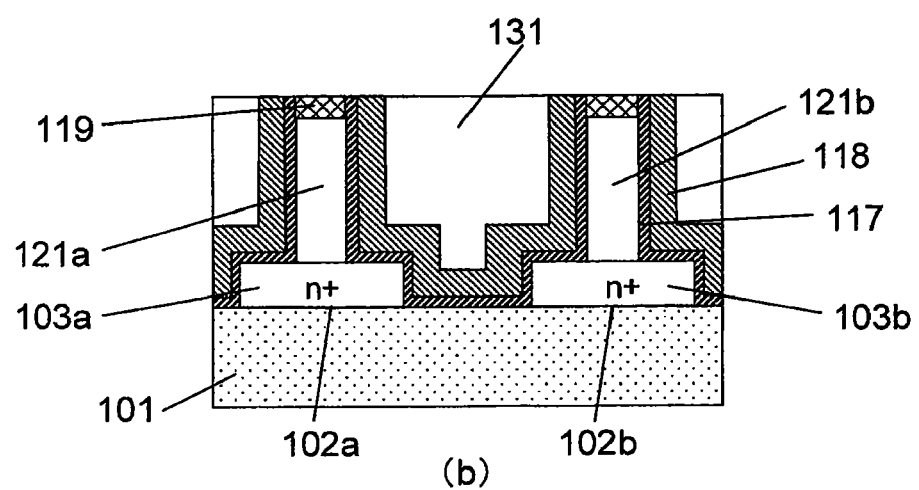
Figure 9:
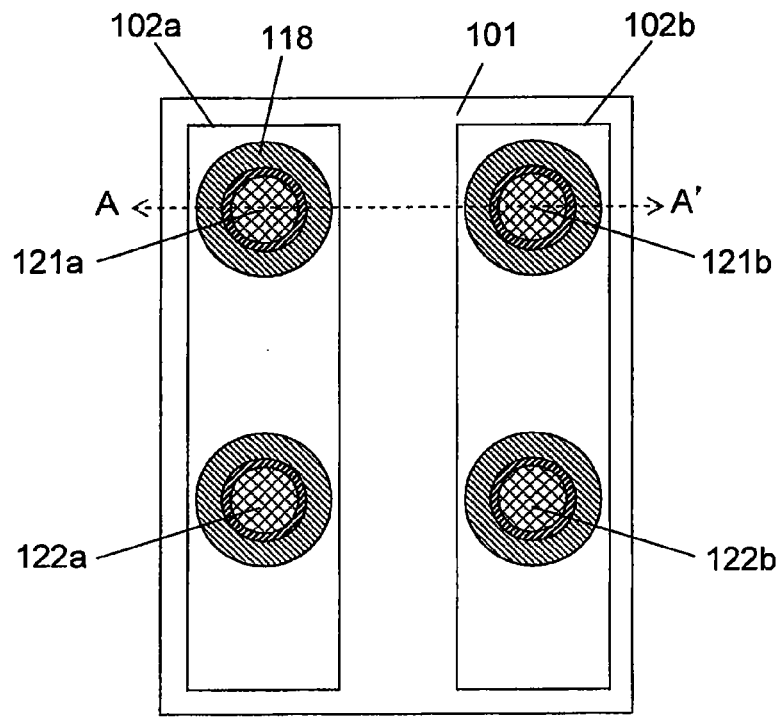
FIGS. 9(a) and 9(b) are process diagrams showing the production process of the SRAM according to the first embodiment, on a step-by-step basis.
Figure 9:
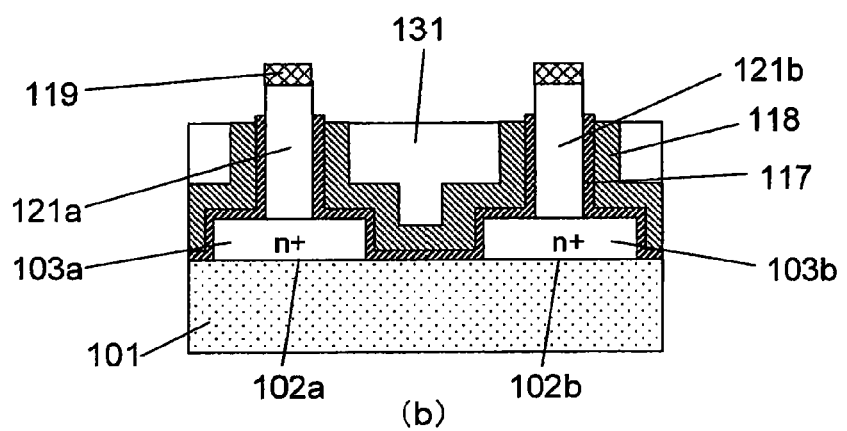
Figure 10:
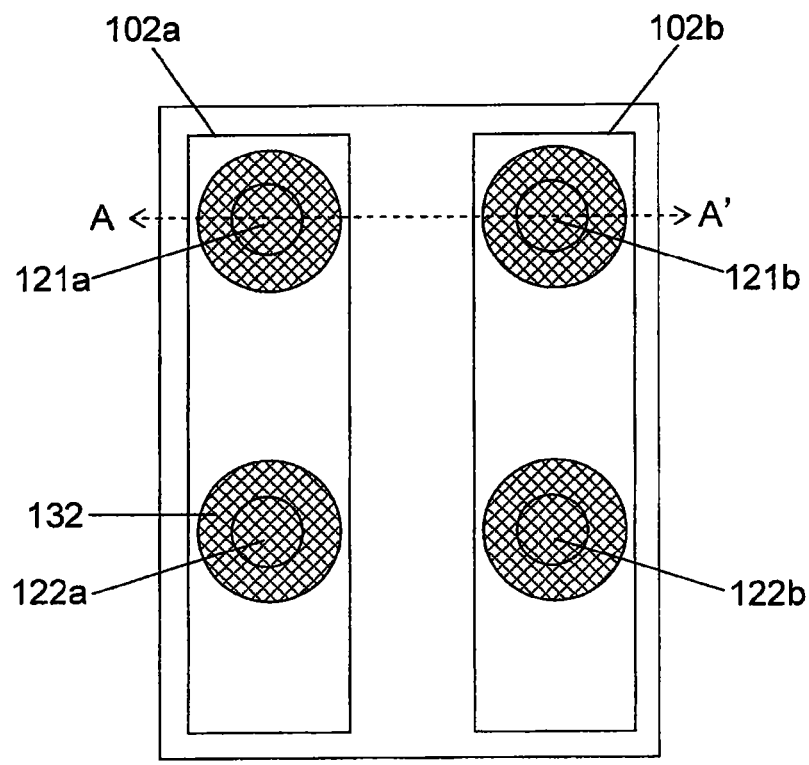
FIGS. 10(a) and 10(b) are process diagrams showing the production process of the SRAM according to the first embodiment, on a step-by-step basis.
Figure 10:
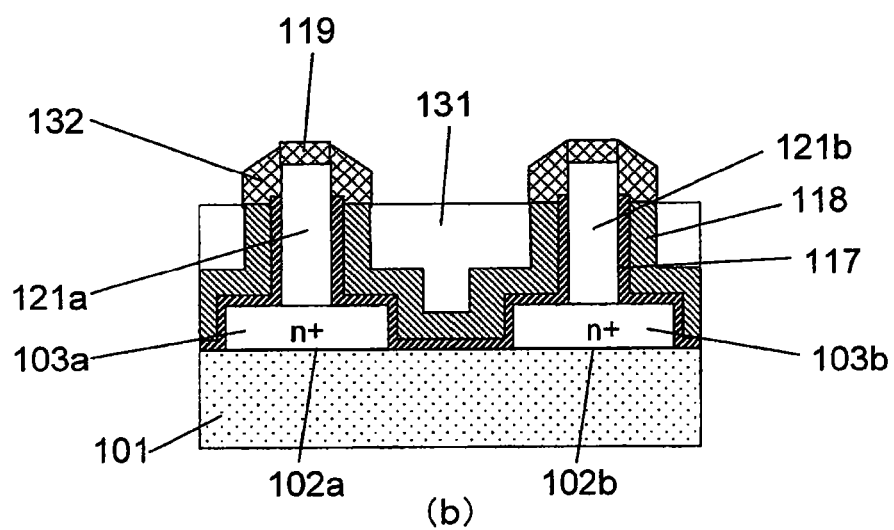
Figure 11:
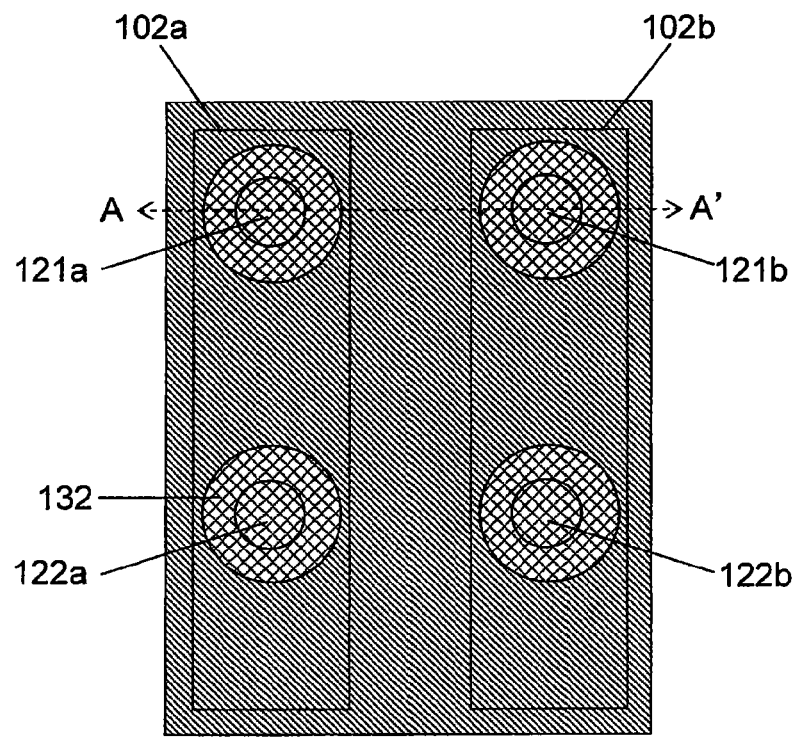
FIGS. 11(a) and 11(b) are process diagrams showing the production process of the SRAM according to the first embodiment, on a step-by-step basis.
Figure 11:
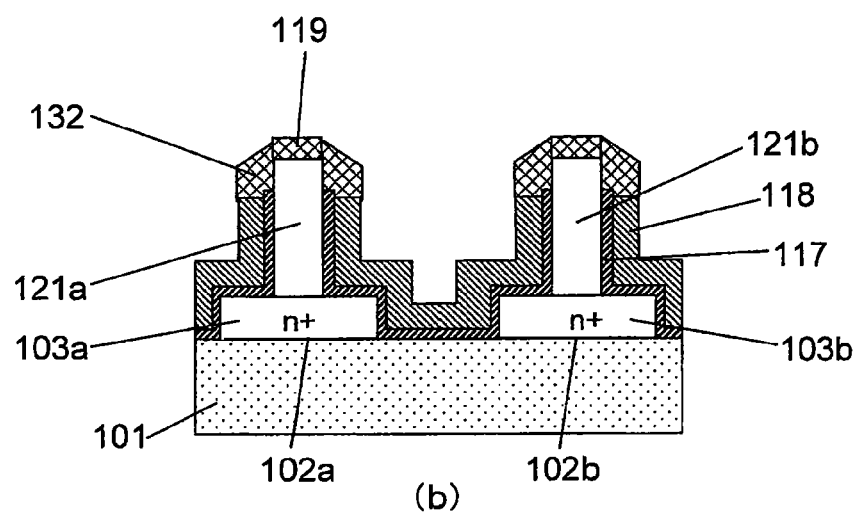
Figure 12:
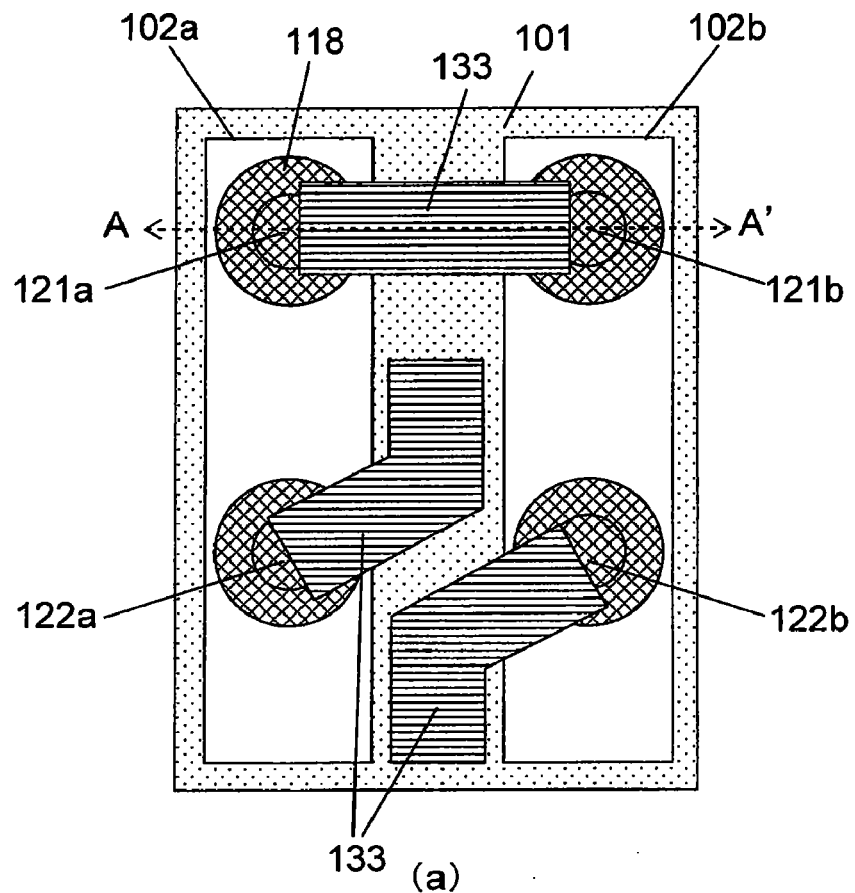
FIGS. 12(a) and 12(b) are process diagrams showing the production process of the SRAM according to the first embodiment, on a step-by-step basis.
Figure 12:
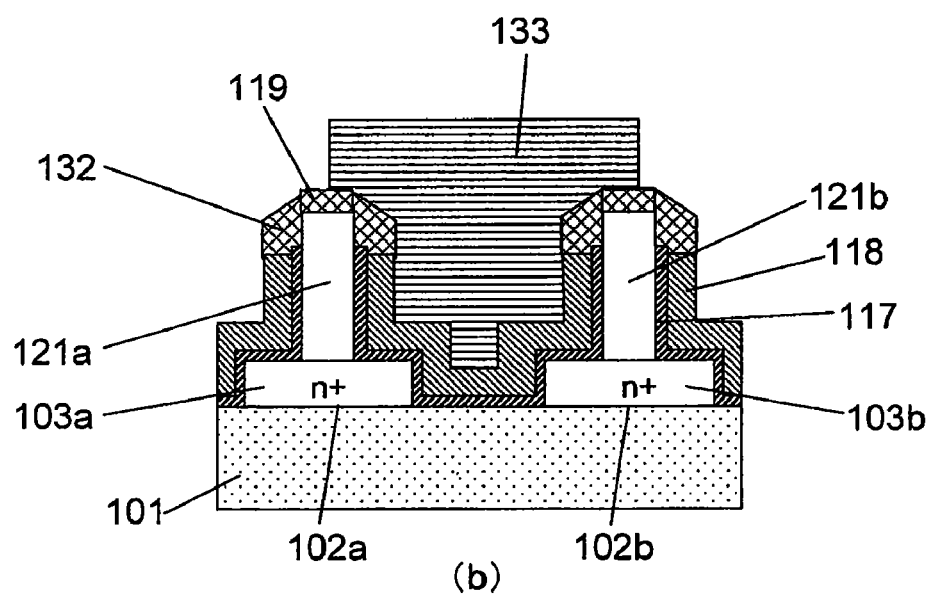
Figure 13:
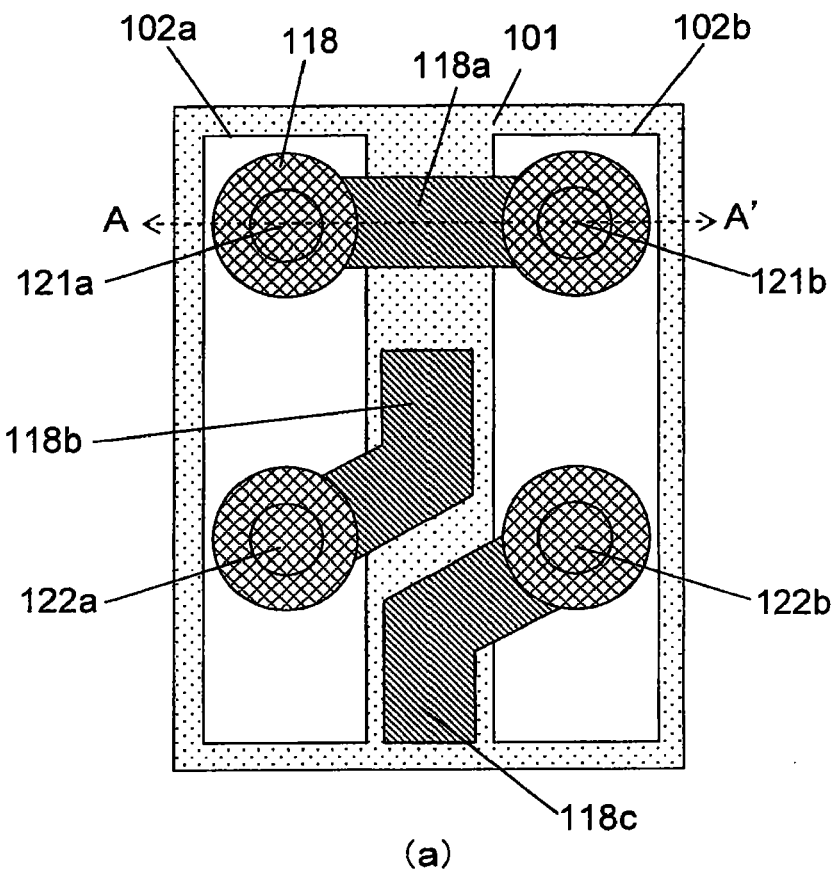
FIGS. 13(a) and 13(b) are process diagrams showing the production process of the SRAM according to the first embodiment, on a step-by-step basis.
Figure 13:
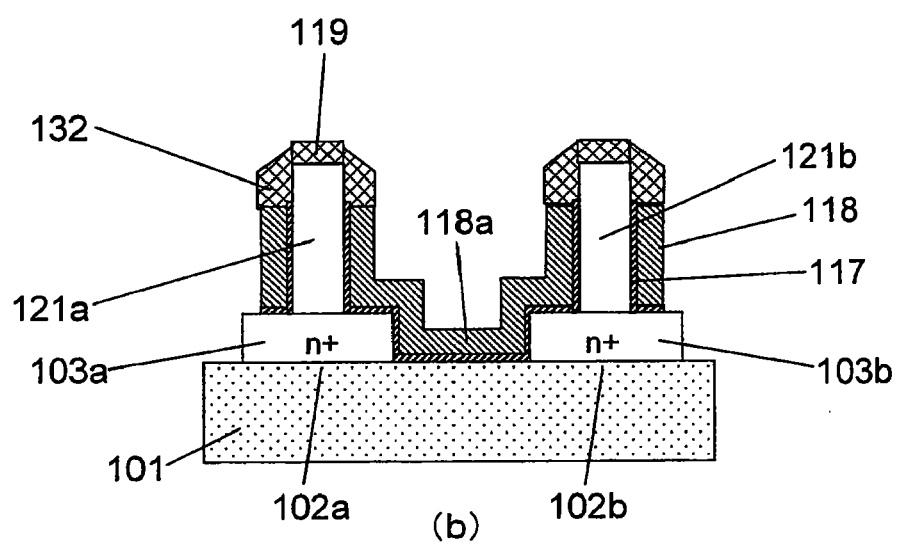
Figure 14:
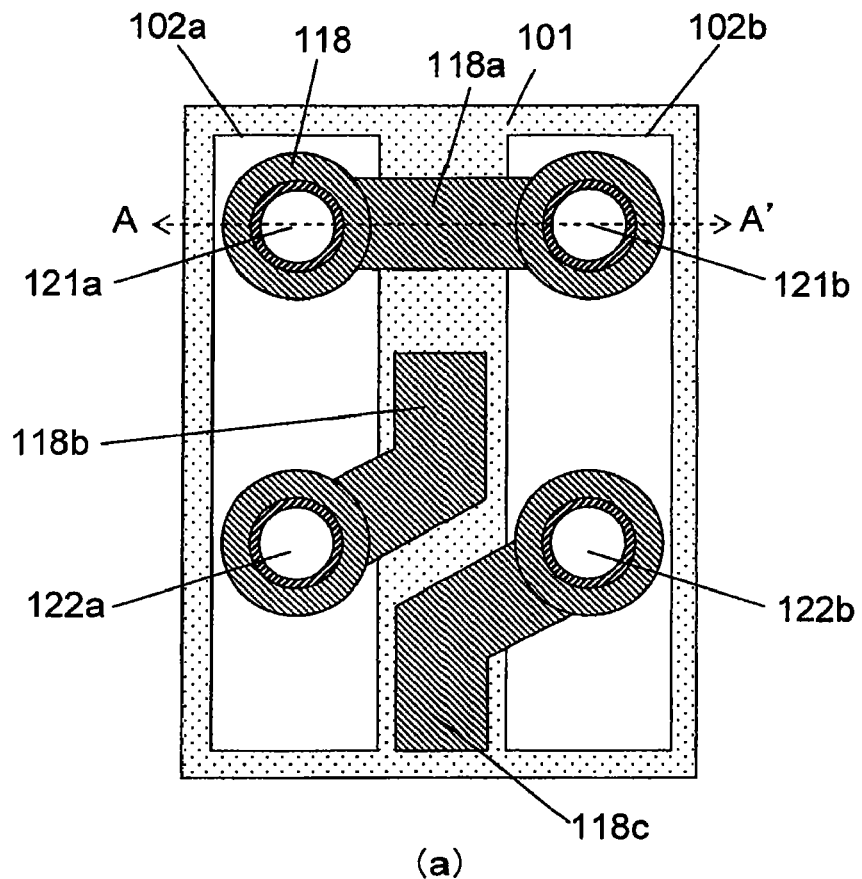
FIGS. 14(a) and 14(b) are process diagrams showing the production process of the SRAM according to the first embodiment, on a step-by-step basis.
Figure 14:
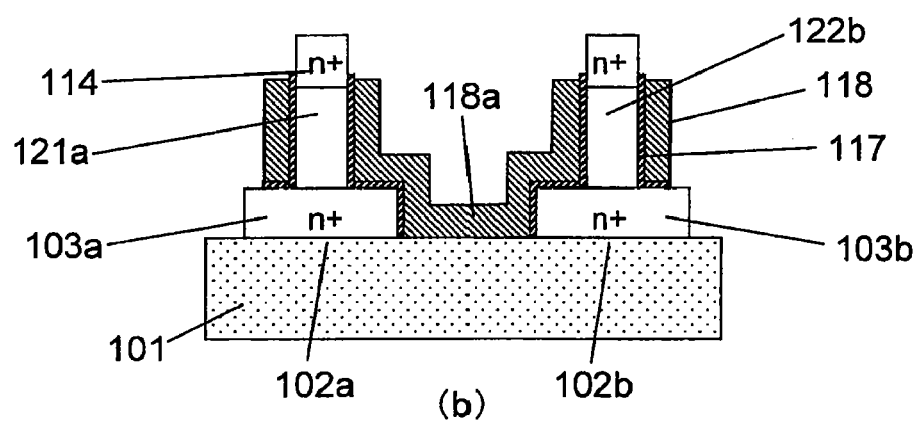
Figure 15:
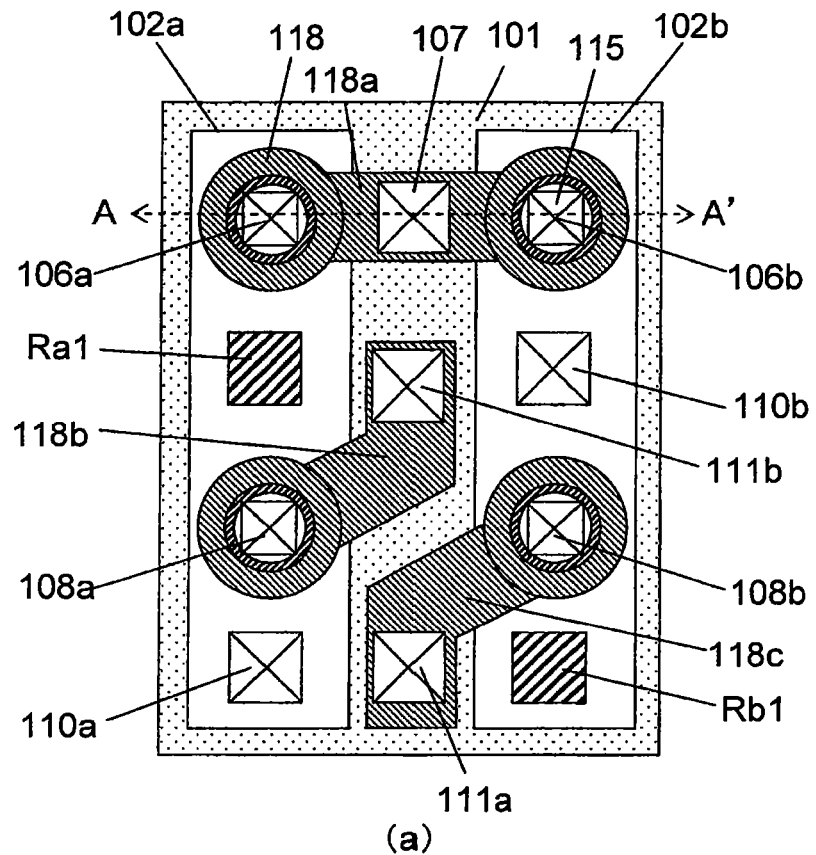
FIGS. 15(a) and 15(b) are process diagrams showing the production process of the SRAM according to the first embodiment, on a step-by-step basis.
Figure 15:
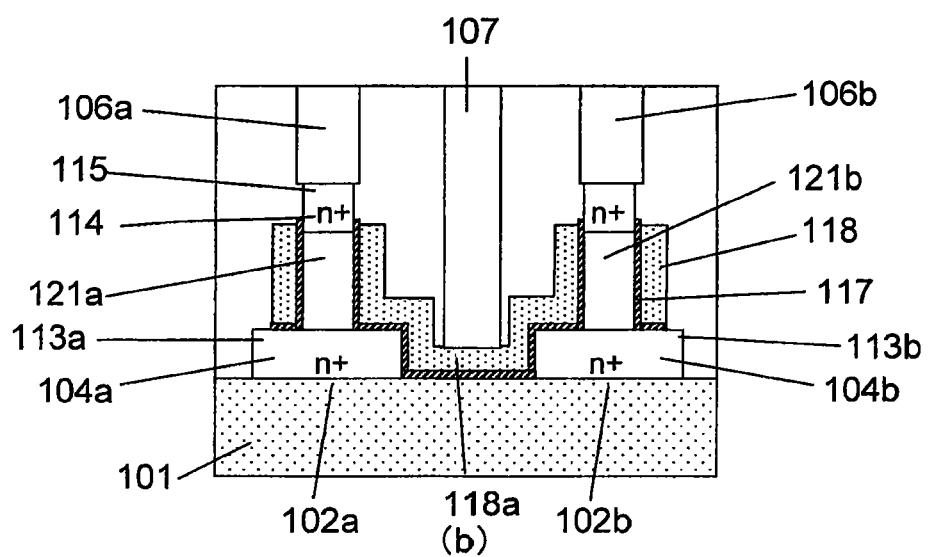

As shown in FIG. 3(d), the planar silicon layer 102a serving as the storage node is formed on the buried oxide film layer 101, wherein the planar silicon layer 102a is formed as the N⁺ drain diffusion layer 103a by impurity implantation or the like. The pillar-shaped silicon layer 121a constituting the access transistor Qa11 and the pillar-shaped silicon layer 122a constituting the driver transistor Qd11 are formed on the planar silicon layer 102a. The gate dielectric film 117 and the gate electrode 118 are formed around each of the pillar-shaped silicon layers. The source diffusion layer 114 is formed in the upper portion of each of the pillar-shaped silicon layers (121a, 122a) by impurity implantation or the like. Although not illustrated in FIG. 3(d), the contact 106a formed on the access transistor Qa11 and the contact 108a formed on the driver transistor Qd11 are connected, respectively, to the bit line BL1 and the ground potential line Vss1, and the polysilicon contact plug Ra1 is connected to a power supply potential line Vcc1a. A contact 110a on the drain diffusion layer 103a is connected a contact 111b formed on a gate line extending from a gate electrode of the driver transistor Qd21, through a storage node interconnection line Na1.

Figure 20:
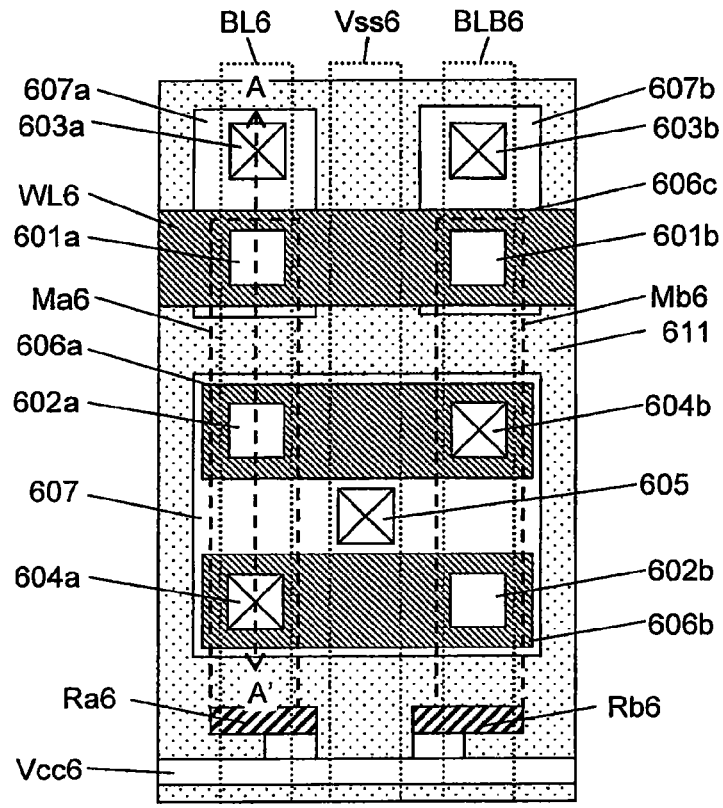
FIGS. 20(a) and 20(b) are, respectively, a top plan view and a sectional view showing a memory cell of a conventional SGT-based SRAM.
Figure 20:
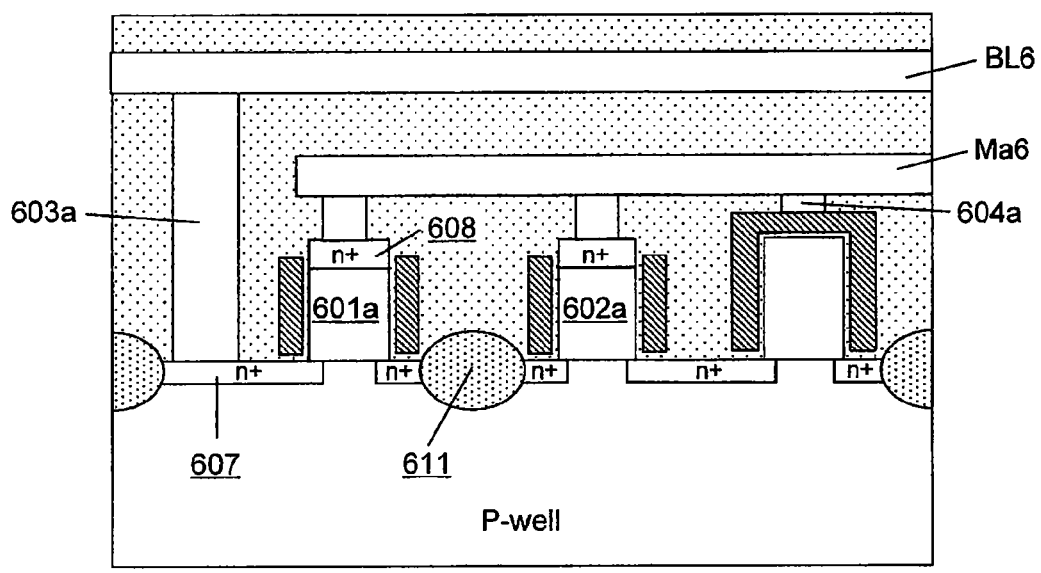

Comparing the SRAM according to the first embodiment with the conventional SRAM illustrated in FIGS. 20(a) and 20(b), the contact (603a, 603b) provided to pull up data to the bit line in the conventional SRAM becomes unnecessary, because the storage node in the first embodiment is formed by the planar silicon layer adjacent to the buried oxide film layer.

Further, a storage node of one SRAM cell in the first embodiment consists of two diffusion layers 103a, 103b, whereas a storage node of one SRAM cell in the conventional SRAM consists of three diffusion layers 607, 607a, 607b. Thus, the SRAM according to the first embodiment has high area efficiency of diffusion layers, so that the SRAM can be designed to have a smaller cell area. In addition, each of the diffusion layers is formed in a simple rectangular shape, which makes it possible to easily correct a pattern shape by OPC (Optical Proximity Correction), and provide a layout suitable for achieving a sufficiently-small SRAM cell area. Further, instead of forming a load resistor element by a polysilicon interconnection layer as in the conventional SRAM, the load resistor element (Ra1, Rb1) in the first embodiment is arranged on the diffusion layer (103a, 103b) each serving as a storage node. Thus, in the first embodiment, a need for ensuring a layout space for load resistor elements, in a region other than an SGT layout region, can be eliminated to further reduce an SRAM cell area as compared with the conventional SRAM.

In the first embodiment, each of the load resistor elements is formed as a contact plug made of a semiconductor material, such as polysilicon. A resistance value of the load resistor element can be controlled by an impurity concentration during formation of a polysilicon film. The contact plug made of a semiconductor material, such as polysilicon, can be formed even in a narrow region between the pillar-shaped silicon layers. This is effective to reduce an SRAM cell area.

Instead of using a semiconductor material, such as polysilicon, the contact plug may be formed by fully embedding a high-resistance metal, such as TiN, into a plug.

Further, instead of the layout of the contact plug as shown in the first embodiment, the contact plug may be optimally arranged while finely adjusting a layout of the SRAM cell, to allow the SRAM cell to be designed to have a sufficiently-small area.

Preferably, in the first embodiment, the gate dielectric film is made of a High-k film, such as a $HfO_2$ film, and the gate electrode is made of a metal film, such as a TiN film or a TaN film, or formed in a laminated structure comprising a metal film and a partially-silicided polysilicon film.

Preferably, in the first embodiment, a channel region of the pillar-shaped silicon layer is doped with no impurity, or has an impurity concentration of $1\ e^{-17}\ cm^{-3}$ or less. The reason is that, if the impurity concentration is greater than this value, a variation in transistor characteristics due to statistical fluctuation of impurities becomes large to cause significant deterioration in SRAM operation margin, such as reading margin. In this case, a threshold adjustment of the transistor may be performed by adjusting a work function of a gate material, instead of the impurity concentration in the channel region.

With reference to FIGS. 4(a) to 15(b), one example of a production method for forming a semiconductor device of the present invention will be described below. In FIGS. 4(a) to 15(b), the figure suffixed with (a) is a top plan view, and the figure suffixed with (b) is a sectional view taken along the line A-A'.

As shown in FIGS. 4(a) and 4(b), a mask 119 of a dielectric film (in this example, a silicon nitride film) having a film thickness of about 50 to 100 nm, is formed on an SOI substrate in which a silicon layer having a film thickness of about 100 to 400 nm is formed on a buried oxide film layer 101. Then, a pattern for a pillar-shaped silicon layer (121a, 121b, 122a, 122b) is formed by lithography, and the silicon layer is etched to form the pillar-shaped silicon layer (121a, 121b, 122a, 122b). The pillar-shaped silicon layer has a diameter of about 5 to 50 nm, and a height dimension of about 30 to 300 nm. In this step, a continuous planar silicon layer 120 is formed underneath the pillar-shaped silicon layer to have a thickness of about 10 to 50 nm.

As shown in FIGS. 5(a) and 5(b), the continuous planar silicon layer 120 is divided to form a planar silicon layer (102a, 102b) serving as a storage node. In this example, an element isolation region can be formed simply by dividing the continuous planar silicon layer. Thus, the element isolation region can be formed to have an isolation width equivalent to a minimum fabrication size, through a process having a less number of steps. Subsequently, an impurity is introduced into the planar silicon layer by ion implantation or the like, in such a manner that the planar silicon layer (102a, 102b) is formed as an N⁺ drain diffusion layer (103a, 103b) underneath the pillar-shaped silicon layer. Preferably, conditions for the implantation are adjusted to allow the impurity to be distributed to reach the buried oxide film layer 101 and cover a bottom of the pillar-shaped silicon layer. In this step, the silicon nitride film 119 prevents the impurity from being introduced into an upper portion of the pillar-shaped silicon layer.

As shown in FIGS. 6(a) and 6(b), a High-k film 117, such as an $HfO_2$ film, is formed as a gate dielectric film to have a thickness of about 1 to 5 nm, by a chemical vacuum deposition (CVD) process or an atomic layer deposition (ALD) process. Subsequently, a metal film 118, such as a TiN film or a TaN film, is formed as a gate conductive film to have a thickness of about 10 to 50 nm.

As shown in FIGS. 7(a) and 7(b), a silicon oxide film 131 is formed to fill a space between the pillar-shaped silicon layers.

As shown in FIGS. 8(a) and 8(b), the silicon oxide film 131, and respective portions of the gate conductive film 118 and the High-k film 117 above the pillar-shaped silicon layer, are polished by chemical mechanical polishing (CMP), to flatten a top surface of a gate. The flattening of the top surface of the gate by the CMP makes it possible to achieve an adequate gate configuration and suppress a variation in gate length. During the CMP, the silicon nitride film-based mask 119 on a top of the pillar-shaped silicon layer is used as a CMP stopper. The use of the silicon nitride film-based mask 119 as a CMP stopper makes it possible to control an amount of CMP with high repeatability.

As shown in FIGS. 9(a) and 9(b), the gate conductive film 118 and the silicon oxide film 131 are etched back to form a gate electrode on a sidewall of the pillar-shaped silicon layer so as to set a gate length. Conditions for the etching are adjusted to allow the gate conductive film 118 and the silicon oxide film 131 to be etched preferably at the same rate, and at a higher selectivity ratio relative to the silicon nitride film-based mask 119.

As shown in FIGS. 10(a) and 10(b), a silicon nitride film is formed and then etched back to form a silicon nitride film-based sidewall 132 on a top of the metal gate. In this step, an amount of the silicon nitride film to be formed and an amount of the silicon nitride film to be etched back are set to allow the silicon nitride film-based sidewall 132 remaining on the gate to accurately cover the gate. A portion of the gate covered by the silicon nitride film-based sidewall will be protected during etching in a subsequent step, so that the gate electrode is formed to have a film thickness of the gate conductive film, in a self-alignment manner.

As shown in FIGS. 11(a) and 11(b), the silicon oxide film 131 remaining on the metal gate is removed by wet etching.

As shown in FIGS. 12(a) and 12(b), a pattern for a gate line is formed by lithography using a resist or multilayer resist 133.

As shown in FIGS. 13(a) and 13(b), a bottom portion of the gate and the High-k film underneath the gate are removed by etching using the resist 133 as a mask. Consequently, a gate line (118a to 118c) is formed. As above, based on the structure where the silicon nitride film is formed on the top of the pillar-shaped silicon layer, the flattening of the top surface of the gate by CMP, the etching for setting the gate length, the formation of the silicon nitride film-based sidewall for protecting the gate electrode, the formation of the pattern for the gate line, and the etching for forming the gate line, are sequentially performed. This makes it possible to form the gate in an adequate configuration and with a small variation in size, and freely form the gate line. In addition, a film thickness of the gate electrode can be controlled in a self-alignment manner, which makes it possible to reduce an occupancy area, and reduce a parasitic resistance between the gate and the diffusion layer.

As shown in FIGS. 14(a) and 14(b), the silicon nitride film-based mask 119 and the silicon nitride film-based sidewall 132 are removed by wet etching. Then, an impurity is introduced into an upper portion of the pillar-shaped silicon layer by ion implantation or the like, to form an $N^+$ source diffusion layer 114 in the upper portion of the pillar-shaped silicon layer.

As shown in FIGS. 15(a) and 15(b), a contact plug (Ra1, Rb1) made of polysilicon or the like is formed as a load resistor element. A resistance value of the contact plug can be adjusted by adding an impurity, such as phosphorus or boron, during formation of the polysilicon, to adjust an impurity concentration. Then, a contact (107, 106a, 108a, 110a, 111a, 106b, 108b, 110b, 111b) is formed in a conventional manner.

Preferably, in the first embodiment, an impurity distribution is set to allow the $N^+$ drain diffusion layer (103a, 103b) underneath the pillar-shaped silicon layer to be formed to reach the buried oxide film layer 101, and an impurity concentration and a size of the pillar-shaped silicon layer are set to allow an inside of the pillar-shaped silicon layer to become fully depleted during a transistor operation. As a result of setting the impurity distribution in the $N^+$ drain diffusion layer (103a, 103b) in the above manner, the inside of the pillar-shaped silicon layer is kept in a floating body structure irrespective of a transistor operation state, which makes it possible to form a transistor insusceptible to a substrate voltage. In addition, as a result of diffusing the impurity for the $N^+$ drain diffusion layer (103a, 103b) to reach the buried oxide film layer 101, a capacitance component in a bottom of the drain diffusion layer is significantly reduced, so that a total parasitic capacitance of the drain diffusion layer can be reduced. In the sectional views of FIGS. 3(a) to 3(d), the impurity is diffused to fully cover the bottom of the pillar-shaped silicon layer. However, even if the impurity does not fully cover the bottom of the pillar-shaped silicon layer, there is no problem in transistor operation.

Second Embodiment

Figure 16:
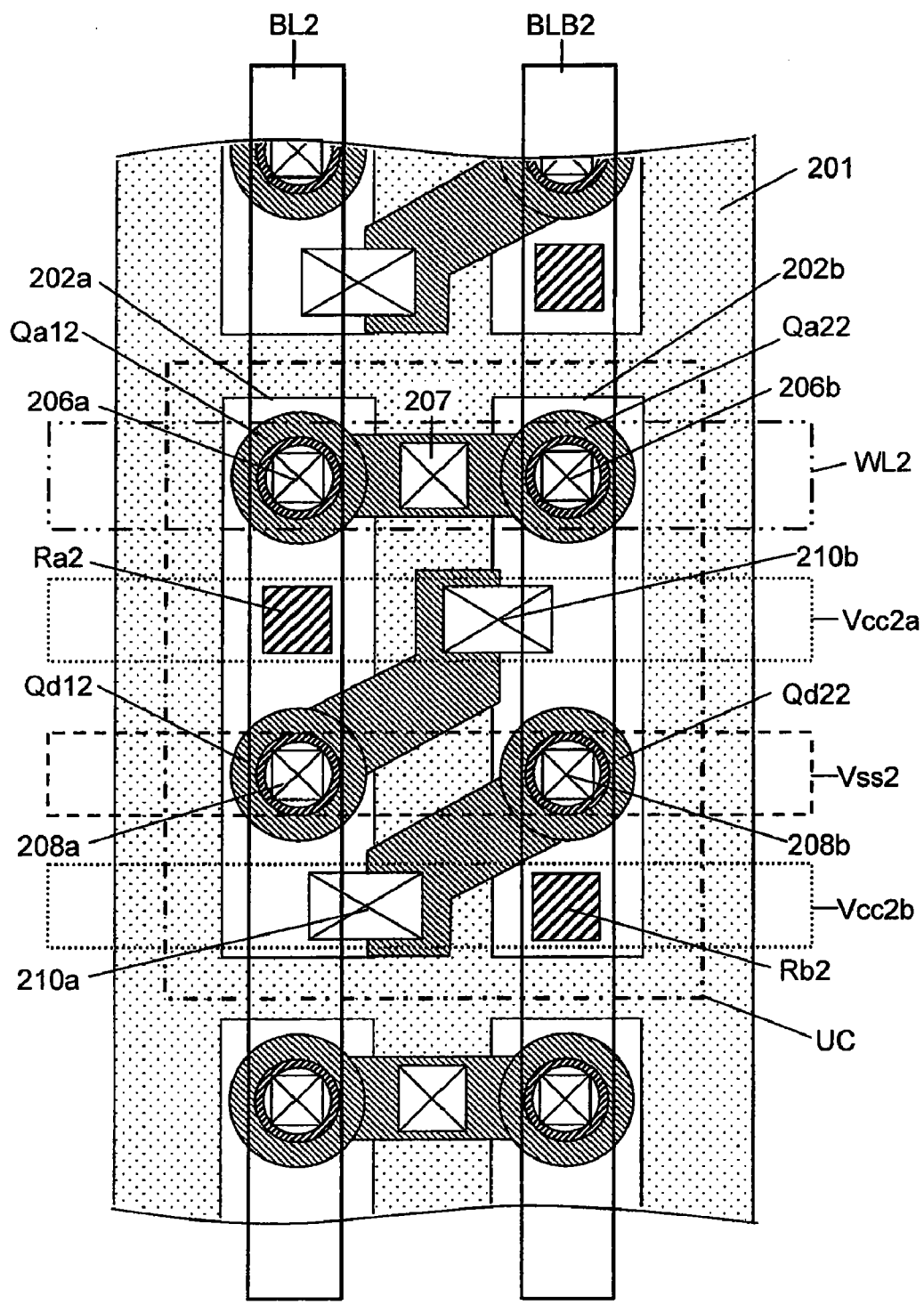
FIG. 16 is a top plan view showing a memory cell of an SRAM according to a second embodiment of the present invention.

FIG. 16 illustrates a layout of a memory cell in an SRAM according to a second embodiment of the present invention. The second embodiment is different from the first embodiment in the following respect. A planar silicon layer 202a serving as a storage node is connected to a gate line extending from a gate electrode of a driver transistor Qd22, through a common contact 210a formed to extend thereacross, and a planar silicon layer 202b serving as a storage node is connected to a gate line extending from a gate electrode of a driver transistor Qd12, through a common contact 210b formed to extend thereacross. As above, the gate and the storage node are connected to each other through the contact, instead of an interconnection layer, so that the number of contacts in the SRAM cell can be reduced. Thus, a cell area can be reduced by adjusting an arrangement of pillar-shaped silicon layers and contacts.

As mentioned in the first embodiment, in order to share each of the word line, the bit line, the power supply potential line and the ground potential line, with other memory cells, such a line is preferably laid out in a higher-level layer than a node interconnection line to be wired in each of the memory cells. In the second embodiment, the node interconnection line is formed by a contact.

The remaining structure is the same as that in the first embodiment, and its description will be omitted.

Third Embodiment

Figure 17:
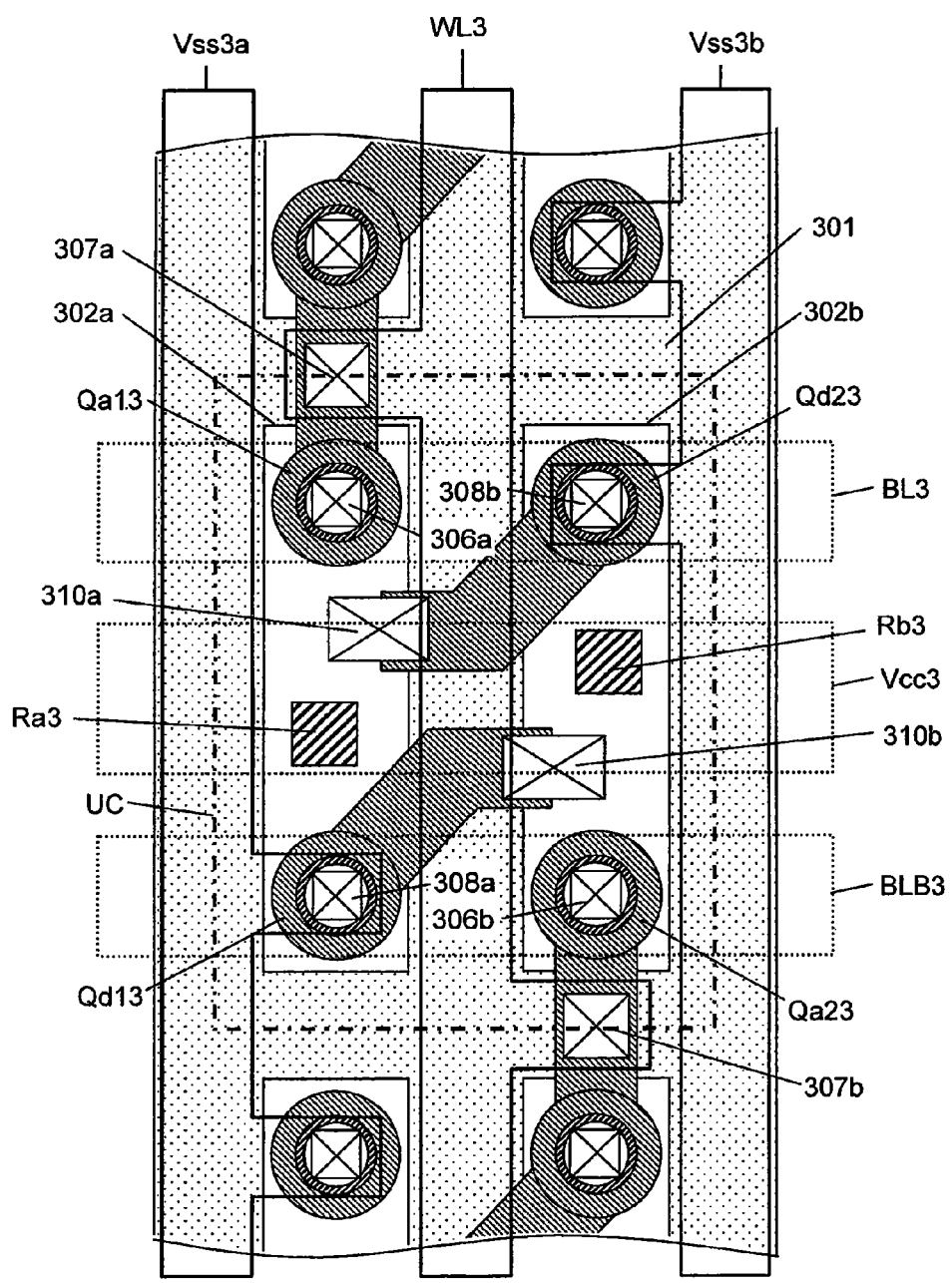
FIG. 17 is a top plan view showing a memory cell of an SRAM according to a third embodiment of the present invention.

FIG. 17 illustrates a layout of a memory cell in an SRAM according to a third embodiment of the present invention. In the third embodiment, an arrangement of two transistors arrayed in the 1st column of a unit cell UC illustrated in FIG. 17 in an SRAM cell array is identical to that of two transistors arrayed in the 2nd column in a memory cell adjacent to and on an upper or lower side of the unit cell UC, and an arrangement of two transistors arrayed in the 2nd column of the unit cell UC is identical to that of two transistors arrayed in the 1st column in the memory cell adjacent to and on the upper or lower side of the unit cell UC. Specifically, two transistors are arrayed on the upper side of transistors Qa13, Qd13 arrayed in the 1st column of the unit cell UC in FIG. 17, in the same arrangement as that of transistors Qa23, Qd23 arrayed in the 2nd column of the unit cell UC in FIG. 17, in this order in a downward direction. Thus, in FIG. 17, an access transistor is disposed adjacent to and on the upper side of the access transistor Qa13, and an access transistor is disposed adjacent to and on the lower side of the access transistor Qa23. In this arrangement of the SRAM cells, a gate line extending from a gate electrode of the access transistor (Qa13, Qa23) can be connected to a gate electrode of the access transistor in the memory cell disposed adjacent to and on the upper or lower side of the unit cell UC in FIG. 17, and a common contact (307a, 307b) connected to a word line WL3 can be formed on the gate line. In the first embodiment, the contact (307a, 307b) connected to the word line WL3 is formed between the two storage nodes. In the third embodiment, the contact (307a, 307b) is disposed on a boundary between the upper and lower SRAM cells, so that a space between the storage nodes can be reduced to reduce a lateral (in FIG. 17) length of the SRAM cell.

As mentioned in the first embodiment, in order to share each of the word line, the bit line, the power supply potential line and the ground potential line, with other memory cells, such a line is preferably laid out in a higher-level layer than a node interconnection line to be wired in each of the memory cells. As one example of the hierarchical wiring configuration, it is contemplated that a node interconnection line (310a, 310b) is wired in a lower-level layer, wherein each of the word line WL3 and a ground potential line (Vss3a, Vss3b) is wired in a mid-level layer, and a bit line (BL3, BLB3) is wired in a higher-level layer, to keep each line from coming in contact with an unintended one of the contacts. In the third embodiment, the node interconnection line is formed by a contact.

The remaining structure is the same as that in the first embodiment, and its description will be omitted.

Fourth Embodiment

Figure 18:
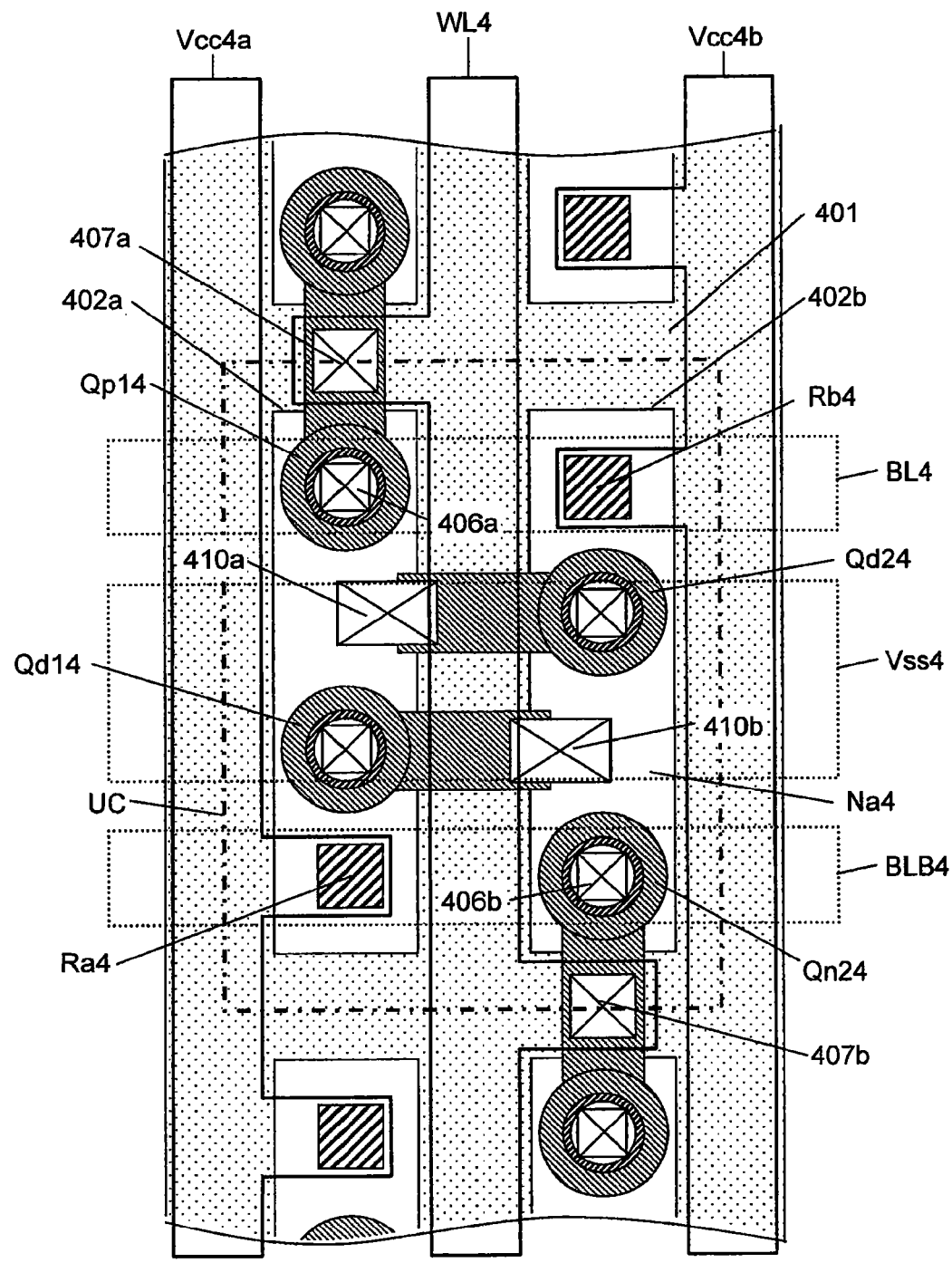
FIG. 18 is a top plan view showing a memory cell of an SRAM according to a fourth embodiment of the present invention.

FIG. 18 illustrates a layout of a memory cell in an SRAM according to a fourth embodiment of the present invention. The fourth embodiment is different from the third embodiments in that a driver transistor Qd14 and a polysilicon contact plug Ra4 are positionally exchanged, and a driver transistor Qd24 and a polysilicon contact plug Rb4 are positionally exchanged. Thus, a gate line can be laid out in a rectangular shape, which facilitates formation of the gate line. Further, in the fourth embodiment, a power supply potential line (Vcc4a, Vcc4b) is formed parallel to a word line WL4, and a ground potential line (Vss4) is formed parallel to a bit line (BL4, BLB4).

As mentioned in the first embodiment, in order to share each of the word line, the bit line, the power supply potential line and the ground potential line, with other memory cells, such a line is preferably laid out in a higher-level layer than a node interconnection line to be wired in each of the memory cells. As one example of the hierarchical wiring configuration, the same configuration as that in the third embodiment may be employed. In the fourth embodiment, the node interconnection line is formed by a contact.

The remaining structure is the same as that in the first embodiment, and its description will be omitted.

Fifth Embodiment

Figure 19:
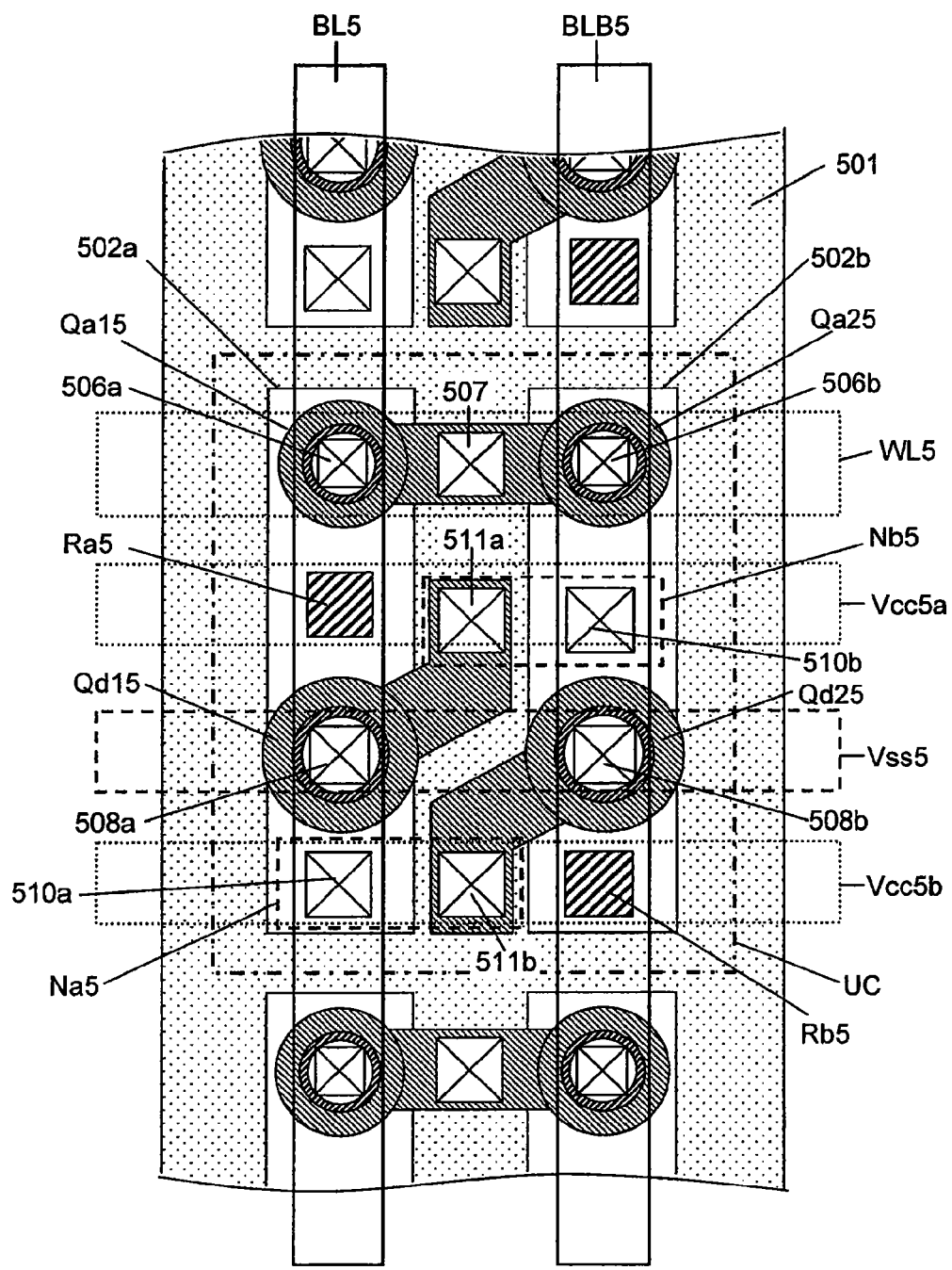
FIG. 19 is a top plan view showing a memory cell of an SRAM according to a fifth embodiment of the present invention.

FIG. 19 illustrates a layout of a memory cell in an SRAM according to a fifth embodiment of the present invention. The fifth embodiment is different from the first embodiments in terms of a shape of a pillar-shaped silicon layer of an access transistor, and a size of a pillar-shaped silicon layer constituting a driver transistor. In an E/R type 4T-SRAM, a reading margin can be improved by enhancing a drive capability of a driver transistor relative to that of an access transistor. The drive capability of the driver transistor can be enhanced relative to that of the access transistor to improve the reading margin, by increasing a peripheral length of a pillar-shaped silicon layer constituting the driver transistor, as in the fifth embodiment.

In cases where there is a need for improving a writing margin, it is effective to enhance the drive capability of the access transistor relative to that of the driver transistor. In this case, a peripheral length of a pillar-shaped silicon layer of the access transistor may be increased to enhance the drive capability of the access transistor relative to that of the driver transistor to improve the writing margin.

However, a channel control function of a gate becomes weaker as a diameter of the pillar-shaped silicon layer is increased, so that short-channel effects become prominent to cause an increase in OFF-leak current of a transistor. Thus, the peripheral length y of the pillar-shaped silicon layer has to be increased while taking into account trade-off between an improvement in transistor performance based on an increase in channel width and an increase in OFF-leak current due to short-channel effects. A cross-sectional shape of the pillar-shaped silicon layer is not limited to a circular shape. For example, the pillar-shaped silicon layer may be formed in an oval shape or a rectangular shape to increase the peripheral length thereof. In this case, the transistor performance can be improved while suppressing short-channel effects.

As above, respective shapes of the access and driver transistors can be changed to adjust various SRAM characteristics.

As mentioned in the first embodiment, in order to share each of the word line, the bit line, the power supply potential line and the ground potential line, with other memory cells, such a line is preferably laid out in a higher-level layer than a node interconnection line to be wired in each of the memory cells. As one example of the hierarchical wiring configuration, the same configuration as that in the first embodiment may be employed.

The remaining structure is the same as that in the first embodiment, and its description will be omitted.

As described above, according to the present invention, in a static type memory cell made up using four MOS transistors and two resistor elements, each of the MOS transistors is formed as an SGT where a drain, a gate and a source are arranged in a vertical direction, and a storage node is form on the side of a substrate to improve area efficiency. Further, an SOI substrate is used to allow an element isolation region with a narrow isolation width to be formed, and each of the resistor elements, such as a contact plugs, is made of a semiconductor material, such as polysilicon. This makes it possible to achieve an E/S type 4T-SRAM with a sufficiently-small memory cell area.

What is claimed is:

1. A semiconductor storage device comprising a static type memory cell in which four MOS transistors and two load resistor elements are arrayed on a dielectric film formed on a substrate, characterized in that:
    each of the four MOS transistors comprises functions as respective ones of first and second NMOS access transistors each operable to hold data in the memory cell, and allow access to the memory cell, and first and second NMOS driver transistors each operable to drive a storage node so as to write and read data in the memory cell, and wherein:
    the first and second NMOS access transistors comprise a first diffusion layer of N-type conduction, a first pillar-shaped semiconductor layer and a second diffusion layer of N-type conduction arranged on a dielectric film formed on the substrate, hierarchically in a vertical direction;
    the first pillar-shaped semiconductor layer is arranged between the first diffusion layer formed on a bottom of the first pillar-shaped semiconductor layer and the second diffusion layer formed on a top of the first pillar-shaped semiconductor layer; and
    a gate is formed along a sidewall of the first pillar-shaped semiconductor layer; and wherein:
    the first and second NMOS driver transistors comprise a third diffusion layer of N-type condition, a second pillar-shaped semiconductor layer and a fourth diffusion layer of N-type conduction arranged on the dielectric film formed on the substrate, hierarchically in a vertical direction,
    the second pillar-shaped semiconductor layer is arranged between the third diffusion layer formed on a bottom of the second pillar-shaped semiconductor layer and the fourth diffusion layer formed on a top of the second pillar-shaped semiconductor layer; and
    a gate is formed along a sidewall of the second pillar-shaped semiconductor layer; and wherein:
    the first NMOS access transistor and the first NMOS driver transistor are arrayed in adjacent relation to each other;
    the second NMOS access transistor and the second NMOS driver transistor are arrayed in adjacent relation to each other;
    the first diffusion layer formed on a bottom of the first NMOS access transistor and the third diffusion layer formed on a bottom of the first NMOS driver transistor are directly connected, and the directly connected first and third diffusion layers serve as a first storage node for holding data;
    the first diffusion layer formed on a bottom of the second NMOS access transistor and the third diffusion layer formed on a bottom of the second NMOS driver transistor are directly connected, and the directly connected first and third diffusion layers serve as a second storage node for holding data; and
    the two load resistor elements are arranged on the first and third diffusion layers serving as the first storage node and the first and third diffusion layers serving as the second storage node.

2. The semiconductor storage device as defined in claim 1, wherein the two load resistor elements are formed as a first contact plug made of a semiconductor or a metal and formed on the first and third diffusion layers serving as the first storage node, and a second contact plug made of a semiconductor or a metal and formed on the first and third diffusion layers serving as the second storage node.

3. The semiconductor storage device as defined in claim 1, wherein a contact formed on a gate line extending from a gate electrode of at least one of the first and second NMOS access transistors is shared as a contact formed on a gate line extending from a gate electrode of an NMOS access transistor in an adjacent memory cell.

4. The semiconductor storage device as defined in claim 1, wherein:
    a gate line extending from the gate of the first NMOS driver transistor formed on the first and third diffusion layers serving as the first storage node is connected to the first and third diffusion layers serving as the second storage node, through a common contact; and
    a gate line extending from the gate of the second NMOS driver transistor formed on the first and third diffusion layers serving as the second storage node is connected to the first and third diffusion layers serving as the first storage node, through a common contact.

5. The semiconductor storage device as defined in claim 1, wherein a peripheral length of the sidewall in each of the pillar-shaped semiconductor layers forming the access transistors and the pillar-shaped semiconductor layers forming the driver transistors, is determined based on an operation margin during reading and an operation margin during writing.

6. The semiconductor storage device as defined in claim 1, wherein the four MOS transistors are arranged on the dielectric film in a two-row by two-column array, and wherein:
    the first NMOS access transistor is arranged at an intersection of the 1st row and the 1st column;
    the first NMOS driver transistor is arranged at an intersection of the 2nd row and the 1st column;
    the second NMOS access transistor is arranged at an intersection of the 1st row and the 2nd column; and
    the second NMOS driver transistor is arranged at an intersection of the 2nd row and the 2nd column.

7. The semiconductor storage device as defined in claim 6, wherein a gate line extending from the respective gates of the first and second NMOS access transistors is connected to a common contact.

8. The semiconductor storage device as defined in claim 1, wherein the four MOS transistors are arranged on the dielectric film in a two-row by two-column array, and wherein:
    the first NMOS access transistor is arranged at an intersection of the 1st row and the 1st column;
    the first NMOS driver transistor is arranged at an intersection of the 2nd row and the 1st column;
    the second NMOS access transistor is arranged at an intersection of the 2nd row and the 2nd column; and
    the second NMOS driver transistor is arranged at an intersection of the 1st row and the 2nd column.

* * * * *